United States Patent
Black et al.

(10) Patent No.: US 11,429,686 B2
(45) Date of Patent: *Aug. 30, 2022

(54) WEB BROWSING ROBOT SYSTEM AND METHOD

(71) Applicant: VM-Robot, Inc., Los Gatos, CA (US)

(72) Inventors: Alistair Black, Los Gatos, CA (US); Daniel Savage, San Jose, CA (US)

(73) Assignee: VM-Robot, Inc., Los Gatos, CA (US)

( * ) Notice: Subject to any disclaimer, the term of this patent is extended or adjusted under 35 U.S.C. 154(b) by 344 days.

This patent is subject to a terminal disclaimer.

(21) Appl. No.: 16/514,542

(22) Filed: Jul. 17, 2019

(65) Prior Publication Data

US 2019/0340204 A1 Nov. 7, 2019

Related U.S. Application Data

(63) Continuation of application No. 15/073,536, filed on Mar. 17, 2016, now Pat. No. 10,402,463.

(Continued)

(51) Int. Cl.
*G06F 16/954* (2019.01)
*G06F 16/957* (2019.01)
(Continued)

(52) U.S. Cl.
CPC .......... *G06F 16/954* (2019.01); *G06F 3/0484* (2013.01); *G06F 16/957* (2019.01); *G06F 30/27* (2020.01); *G06F 3/0481* (2013.01)

(58) Field of Classification Search
CPC .... G06F 16/954; G06F 16/957; G06F 3/0481; G06F 3/0484; G06F 30/27
See application file for complete search history.

(56) References Cited

U.S. PATENT DOCUMENTS

| | | | |
|---|---|---|---|
| 6,920,505 B2 * | 7/2005 | Hals | G06F 16/9535 709/200 |
| 8,462,134 B2 * | 6/2013 | Matejka | G06F 3/0488 345/174 |

(Continued)

FOREIGN PATENT DOCUMENTS

CN 104361093 A * 2/2015 ....... G06F 17/30873

OTHER PUBLICATIONS

Michael Schrenk; "Webbots, Spiders, and Screen Scrapers, 2nd Edition"; William Pollock; 2012 (Year: 2012).*

(Continued)

*Primary Examiner* — Dennis Truong
(74) *Attorney, Agent, or Firm* — David R. Stevens; Stevens Law Group

(57) ABSTRACT

A method for using a robot on the web is disclosed. The method may include assigning a goal to a robot. The robot may then direct a web browser to code corresponding to a URL. Using the code, the web browser may render a webpage comprising a plurality of rendered elements. The robot may identify each rendered element by using OCR or an OCR equivalent or by positioning a virtual mouse in a plurality of locations on the webpage and obtaining, from the code, element-identification information corresponding to each location. The robot may map each rendered elements with an element type selected from a closed set of element types stored within a knowledge base accessible by the robot. The robot may further select, from a set of possible actions, an action corresponding to each rendered element that is most likely to lead toward the goal and implement each such action.

12 Claims, 10 Drawing Sheets

Related U.S. Application Data

(60) Provisional application No. 62/134,200, filed on Mar. 17, 2015.

(51) Int. Cl.
   *G06F 3/0484*    (2022.01)
   *G06F 3/0481*    (2022.01)
   *G06F 30/27*     (2020.01)

(56) References Cited

U.S. PATENT DOCUMENTS

| | | | | |
|---|---|---|---|---|
| 8,930,296 B2* | 1/2015 | McBride | | G06N 5/025 |
| | | | | 706/47 |
| 2001/0034658 A1* | 10/2001 | Silva | | G06Q 30/0633 |
| | | | | 705/26.8 |
| 2002/0190946 A1* | 12/2002 | Metzger | | G06F 3/04842 |
| | | | | 345/156 |
| 2002/0194161 A1* | 12/2002 | McNamee | | G06F 16/951 |
| 2004/0068693 A1* | 4/2004 | Rawat | | G06F 16/972 |
| | | | | 715/226 |
| 2004/0141015 A1* | 7/2004 | Fitzmaurice | | G06F 3/04842 |
| | | | | 715/856 |
| 2005/0104852 A1* | 5/2005 | Emerson | | G06F 3/038 |
| | | | | 345/157 |
| 2005/0216356 A1* | 9/2005 | Pearce | | G06F 40/174 |
| | | | | 715/207 |
| 2005/0257148 A1* | 11/2005 | Goodman | | G06F 40/174 |
| | | | | 715/226 |
| 2006/0026231 A1* | 2/2006 | Degenhardt | | G06Q 10/10 |
| | | | | 709/204 |
| 2006/0190561 A1* | 8/2006 | Conboy | | G06F 16/951 |
| | | | | 709/217 |
| 2007/0043878 A1* | 2/2007 | Carlson | | H04L 51/066 |
| | | | | 709/246 |
| 2007/0130022 A1* | 6/2007 | Prescott | | G06Q 30/06 |
| | | | | 705/26.41 |
| 2007/0180380 A1* | 8/2007 | Khavari | | G06F 16/957 |
| | | | | 715/704 |
| 2008/0098300 A1* | 4/2008 | Corrales | | G06F 16/986 |
| | | | | 715/243 |
| 2008/0172598 A1* | 7/2008 | Jacobsen | | H04L 63/12 |
| | | | | 715/224 |
| 2008/0178162 A1* | 7/2008 | Sanford | | G06F 16/951 |
| | | | | 717/139 |
| 2010/0080411 A1* | 4/2010 | Deliyannis | | G06F 16/951 |
| | | | | 382/100 |
| 2012/0116921 A1* | 5/2012 | Fogel | | G06Q 10/0633 |
| | | | | 705/26.81 |
| 2014/0236875 A1* | 8/2014 | Phillipps | | G06F 16/957 |
| | | | | 706/12 |
| 2014/0258262 A1* | 9/2014 | Balz | | G06F 3/0481 |
| | | | | 707/709 |
| 2015/0106357 A1* | 4/2015 | Sun | | G06F 16/951 |
| | | | | 707/709 |
| 2015/0120508 A1* | 4/2015 | Black | | G06Q 30/0635 |
| | | | | 705/26.81 |
| 2015/0370901 A1* | 12/2015 | Sobeck | | G06F 16/951 |
| | | | | 707/710 |
| 2016/0044380 A1* | 2/2016 | Barrett | | H04N 21/812 |
| | | | | 725/53 |
| 2016/0191338 A1* | 6/2016 | Sankaranarasimhan | | G06F 3/04817 |
| | | | | 715/738 |
| 2016/0232194 A1* | 8/2016 | Abraham | | H04L 67/02 |
| 2016/0259651 A1* | 9/2016 | Nychis | | G06F 9/4488 |
| 2016/0306974 A1* | 10/2016 | Turgeman | | G06F 21/121 |
| 2017/0031873 A1* | 2/2017 | Levi | | G06F 40/106 |
| 2018/0275783 A1* | 9/2018 | Thompson | | G06F 3/0488 |

OTHER PUBLICATIONS

Chou, Pao-Hua, et al. "Integrating web mining and neural network for personalized e-commerce automatic service." Expert Systems with applications 37.4 (2010): 2898-2910 (Year: 2010).*

* cited by examiner

WEB BROWSING ROBOT SYSTEM AND METHOD

RELATED APPLICATION

This application is a continuation of U.S. patent application Ser. No. 15/073,536, filed Mar. 17, 2016, which claims the benefit of U.S. Provisional Patent Application Ser. No. 62/134,200 filed Mar. 17, 2015, which are incorporated by reference in their entirety.

BACKGROUND

Field of the Invention

This invention relates to intelligent machines and more particularly to systems and methods for robots that intelligently navigate Internet webpages in order to accomplish defined goals.

Background of the Invention

Humans browse the web in predictable patterns. Such browsing may include web surfing, participating in social media, vacation planning, online purchasing, and the like. Sometimes, a process such as website testing, financial analysis, online data gathering, online shopping, or even the use of an online application may take up a considerable amount of a user's time. Other times, a user may have to put in a considerable amount of effort browsing the web to look for information about a specific item or a specific transaction. Accordingly, what is needed is a system that reduces the time that a human needs to spend performing certain tasks on the web.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
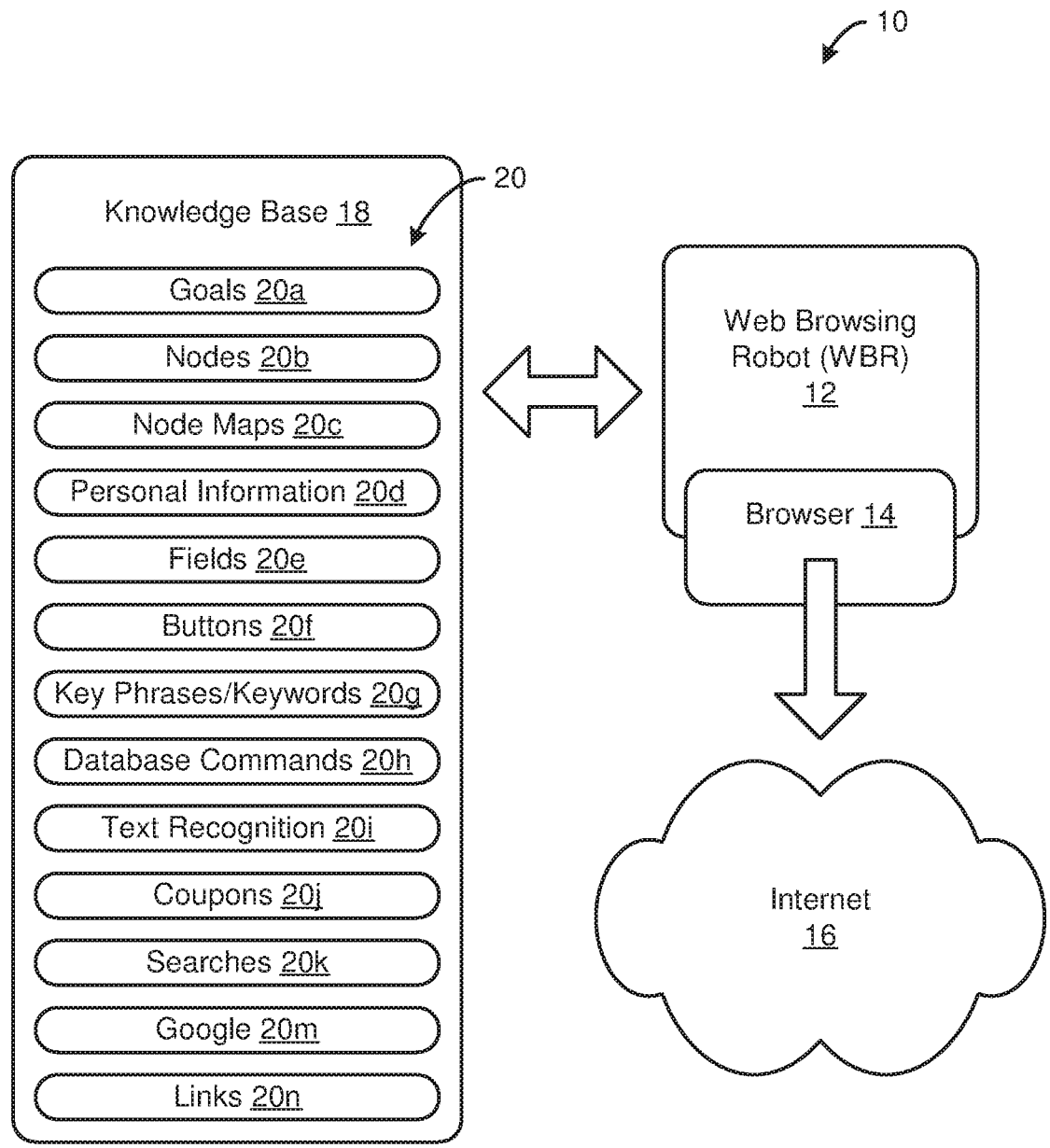
FIG. 1 is a schematic diagram illustrating one embodiment of a system in accordance with the present invention.

Referring to FIG. 1, a system 10 in accordance with the present invention may comprise a robot 12 (e.g., a Web Browsing Robot (WBR)) using or controlling a web browser 14 to interact with one or more webpages hosted on a computer network 16 such as the Internet. A system 10 may do this in any suitable method. For example, a system 10 may be embodied as hardware, software, or some combination thereof.

In selected embodiments, a system 10 in accordance with the present invention may include one or more robots 12. The number of robots 12 may be scaled according to the amount of work that needs to be accomplished. Accordingly, in certain embodiments, a relatively small number of robots 12 may be sufficient. In other embodiments, hundreds, thousands, hundreds of thousands, or even millions of robots 12 may be created and used within a system 10 to accomplish the work assigned to that system 10.

In certain embodiments, at any given time, each robot 12 of a system 10 may have a specific task or goal assigned thereto. The goal of any robot 12 may be to accomplish a specific task such as purchasing an item, collecting information on a specific subject, or the like. In any event, a robot 12 may be programmed to surf and navigate webpages. A robot 12 may accomplish such surfing, not by analyzing the computer code used to construct webpages, but by analyzing the content rendered or actually presented on a webpage.

Based on its analysis of a webpage, a robot 12 may make certain decisions or follow certain steps that a human would follow. Accordingly, a system 10 in accordance with the present invention may "humanize" the way in which a robot 12 surfs the Internet, performs tasks, and collects information. In order to accomplish this humanization, a system 10 may include a knowledge base 18. The one or more robots 12 of a system 10 may have access to the knowledge base 18 and be able to draw thereupon as needed.

Learned and trained knowledge may be stored within a knowledge base 18 in the form of one or more databases 20 that are each accessible to a robot 12. Each such database 20 may be a comprehensive information storage entity that contains exhaustive, or near exhaustive, lists and look-up tables of specific information. That information may include information on the World Wide Web (i.e., the web), how to navigate the web, the different possible human-like actions that a robot 12 may need to take in a particular robot-control browsing session, or the like or a combination or sub-combination thereof.

In selected embodiments, a knowledge base 18 may include a goal database 20*a* identifying or characterizing one or more goals. Each goal may be or comprise something that a robot 12 needs to see to stop and return with appropriate data or end execution of an operation or particular workflow. In certain embodiments, a goal stored within a goal database 20*a* may be a specific webpage, certain amount of accumulated data, specific control signal of some kind, or the like.

Various types of goals may be stored within a goal database 20*a*. For example, a goal database 20*a* may store one or more goals that a robot 12 "knows" how to achieve. Accordingly, a robot 12 may execute a known path to a specific goal upon a triggering event (e.g., a command or request received from a human user of a system 10). For example, online purchases from a specific retailer may involve a known path or workflow that is used over and over. Alternatively, or in addition thereto, a goal database 20*a* may store one or more goals that are defined, but not yet mapped. For example, a defined goal that is not yet fully mapped may be a data gathering goal.

In selected embodiments, as goals are added to a goal database 20*a*, one or more robots 12 may be sent to learn how to accomplish those goals. Multiple robots 12 may share access to a knowledge base 18 or to any or all of the databases 20 thereof. This may improve operation of a system 10 in accordance with the present invention. For example, when multiple robots 12 share any of the databases 20 of a knowledge base 18, it may improve the likelihood that an assigned goal will be achieved.

In certain embodiments, a knowledge base 18 may include a node database 20*b*. A node may be or comprise a webpage or a portion of a webpage that forms part of a node network or a specific workflow within a node network. A node database 20*b* may store information identifying, defining, or otherwise characterizing each of one or more nodes. For example, in selected embodiments, a node database 20*b* may include a node list corresponding to one or more nodes.

A node list may be or include a list of blocks, physical locations on a webpage, tags, and/or other relevant information corresponding to one or more nodes. In certain embodiments, each node list may comprise elements (e.g., human-interaction-element types or elements of the type that human users typically interact with as they access and use webpages) such as forms, links, buttons, text locations, or the like or a combination or sub-combination thereof for a particular node. A node list may also contain one or more "replay" files that are sequential lists of operations taken by one or more other robots 12 when they successfully processed or interacted with a corresponding node (e.g., a corresponding webpage).

In many situations, a replay file may be used to interact with a node in a "replay" manner, wherein new data (e.g., data corresponding to the goal of a current robot 12) may be substituted into current operations that track or are patterned after previous operations performed on the node. In certain situations, an existing replay file or a sequence defined thereby may not work for a given node. This may be due to changes in the physical structure of a rendered webpage. For example, state changes in webpage logic or actual code changes in the webpage itself may render one or more replay files or sequences obsolete. Accordingly, in such situations, a robot 12 may perform a full scan of the node in order to move forward toward an assigned goal. The results of this new scan and a corresponding replay file may then be stored in a knowledge base 18 for future use by robots 12 that encounter the node.

In selected embodiments, a knowledge base 18 may include a node-map database 20*c*. Such a database 20*c* may store many maps (e.g., large and small maps) showing how various nodes connect together. For example, a small map stored within a node-map database 20*c* may be or comprise a workflow connecting a relatively small number of nodes (e.g., about 5 to about 10 nodes) in a specific order. Such a map may give a robot 12 current knowledge regarding how nodes (e.g., webpages or portions of webpages) are connected together and what buttons may be selected to go from one node to the next node on the map.

In general, a robot 12 may follow a map. However, there are occasions when a robot 12 may deviate from a map and learn about new nodes connected or relating to that network. These deviations may be learning operations. A robot 12 may try all methods of which it is aware to move from one node to another node seeking to accomplish its assigned goal. Once the goal is met, new information may be added to an existing map to reflect the new path discovered by the robot 12.

In selected embodiments, a knowledge base 18 may include a personal information database 20*d*. Personal information may be information that corresponds closely to one or more human users for whom one or more robots 12 have been assigned to act. For example, a robot 12 may be assigned to purchase an item for a particular human user. Accordingly, a robot 12 may have access to (e.g., via a personal information database 20*d*) the kind of information it will need to act on behalf of that user. Such information may include the name of the user, the shipping and billing addresses associated with the user, cookies, other personal information, credentials (passwords, credit card numbers), or the like or a combination or sub-combination thereof.

In selected embodiments, a knowledge base 18 may include a field database 20*e*. A field may be an input field that a user may encounter on a webpage. Certain fields may enable users of a webpage to type in data such as name, address, telephone number, credit card information, shipping address, billing address, coupon code, web address (URL), password, or the like. Other fields may enable users of a webpage to select, from an array of predefined choices, data such as size, color, shipping method, payment method, or the like.

To accomplish certain goals, a robot 12 may need to enter relevant information in the appropriate fields on a webpage. Accordingly, a field database 20*e* may store an exhaustive, or near exhaustive, list of possible fields that a human user or robot 12 may encounter in pursuit of a goal. In certain embodiments, selected fields within a field database 20*e* may have different names, but still map to the same function or methods. For example, "phone number" and "telephone" may be synonymous. Accordingly, such fields may be linked together or mapped in some manner within a field database 20*e*.

In selected embodiments, a knowledge base 18 may include a button database 20*f*. Buttons may be selectable (e.g., clickable) objects rendered on a webpage. When a button is selected, an action corresponding thereto may be taken or initiated. A button database 20*f* may store an exhaustive, or near exhaustive, list of buttons that a human user or robot 12 may encounter in pursuit of a goal.

A button database 20f may take into account and/or accommodate certain subtleties or varieties of usage. Specifically, different websites might use different nomenclature on buttons that perform the same function. For example, in the online retail environment, a particular button may need to be selected to complete the purchase. This button may be referred to or labeled as "buy," "buy now," "purchase," "place order," "submit order," "submit," "continue," "complete transaction," or the like. Accordingly, a button database 20f may store, link, and/or map a wide variety of possible button labeling options to the function corresponding to each button.

In selected embodiments, a knowledge base 18 may include a key phrase and/or keyword database 20g. Various important key phrases and/or keywords may be stored within such a database 20g. Accordingly, a robot 12 may refer to a key phrase and/or keyword database 20g when it needs to look up or search any key phrase or keyword. For example, when a robot 12 navigates to a particular node there may be a need to identify that node. In selected embodiments, the node may be identified by finding the names or labels corresponding to one or more buttons and/or fields and comparing them to a database list of key phrases or keywords. Once the key phrases and/or keywords of a node are known, they may be used to determine what information needs to be entered into the fields and/or which buttons need to be selected for the corresponding robot 12 to advance toward the goal.

In selected embodiments, a knowledge base 18 may include a database 20h of database commands. Such a database 20h may store a comprehensive list of database commands associated with various databases, records, and database transactions. A robot 12 may refer to such a database 20h when it needs to issue a query or otherwise interact with an online database.

In selected embodiments, a knowledge base 18 may include text recognition database 20i. That is, in certain embodiments, a robot 12 may be configured or programmed to parse text on a webpage. Accordingly, certain rules for text recognition may be stored within a text recognition database 20i in order to be accessible to such a robot 12. In certain embodiments, selected key phrases or keywords that may be useful to a robot 12 in reaching a goal may be kept in a text recognition database 20i. Accordingly, when a robot 12 finds text, that text may be scanned for key phrases or keywords related to a current goal.

In selected embodiments, a knowledge base 18 may include a coupon database 20j. Such a database 20j may store a list (e.g., an extensive, exhaustive, or near exhaustive list) of coupons from various retailers for different online purchases. Accordingly, a robot 12 may access and use one or more coupons (e.g., coupon codes) stored within a coupon database 20j to advance toward a goal.

In selected embodiments, a knowledge base 18 may include a search database 20k. A search database 20k may store the results of one or more searches. This may enable a robot 12 to keep working or return to working on those search results without executing or commissioning a new search.

In selected embodiments, a knowledge base 18 may include a "Google," "Yahoo," or "Bing" database 20m or the like storing search results corresponding to a particular Internet search engine. For example, to accomplish a given goal, a robot 12 may need to consult a search engine to obtain a list of URLs to visit. Accordingly, a database 20m dedicated to that search engine and the results obtained therefrom may enable a robot 12 to keep working or return to working on that list of URLs without executing or commissioning a new search on the search engine.

In selected embodiments, a knowledge base 18 may include a link database 20n. A link database 20n may store data identifying or characterizing one or more links between nodes, other data, or the like. Accordingly, a link database 20n may enable a robot 12 to reach a goal more quickly than may otherwise be possible.

The information stored within one or more databases 20 of a knowledge base 18 may not be static. Accordingly, even as the information stored within a knowledge base 18 is being accessed and used by one or more robots 12, it may be constantly updated by robots 12 as they learn new information and by one or more human managers of a system 10.

The various databases 20 illustrated in FIG. 1 and discussed hereinabove are provided by way of example and not by way of limitation. A knowledge base 18 may include any arrangement or collection of data and/or databases 20 that are desired or necessary to support the functionality of a robot 12 in accordance with the present invention.

Certain robots 12 in accordance with the present invention may have an identity that corresponds to the information associated therewith. For example, the identity of a robot 12 may include the name of a human user, shipping and billing addresses associated with that user, cookies, other personal information, credentials (e.g., passwords, credit card numbers), or the like. In other words, the identity of a robot 12 may correspond to any information used to identify a human user or that a human user may need while navigating the web. Alternatively, or in addition thereto, an identity of a robot 12 may be or include the goal currently assigned thereto.

Figure 2:
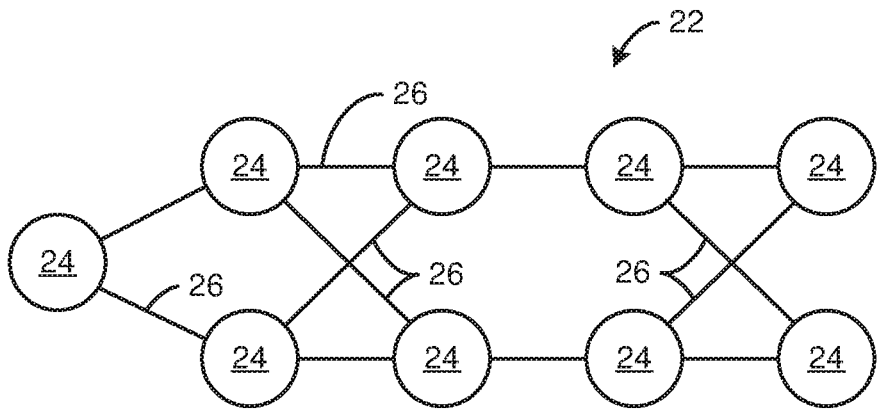
FIG. 2 is a schematic diagram illustrating one embodiment of a node network.

Referring to FIG. 2, one or more robots 12 of a system 10 in accordance with the present invention may each have a task or goal to accomplish. A formal, well defined goal may guide the decisions of a robot 12 and make clear when the goal has been accomplished. In selected embodiments or situations, a node map 22 may model a goal or task assigned to a robot 12.

A network node map 22 may be a mesh network with an arbitrary connection scheme. In selected embodiments, a network node map 22 may represent a linked section of the web. A network node map 22 may comprise a plurality of nodes 24 interconnected by a plurality of links 26. A network node map 22 may be an effort to capture or represent all possible nodes 24 within a particular section of the web to form a set of nodes 24 and node states.

For example, if a robot 12 is tasked with making an online purchase, a node 24 in a corresponding network node map 22 may represent a given webpage or a portion of a given webpage in a purchase workflow. Contained within one such node 24 may be fields for receiving a name, credit card number, or the like and buttons labeled with "continue," "next," "submit," etc. Accordingly, in certain embodiments or situations, a network node map 22 may be viewed as a simple state machine, wherein a system 10 transitions sequentially from one state to a next in an attempt to complete a specific task.

Figure 3:
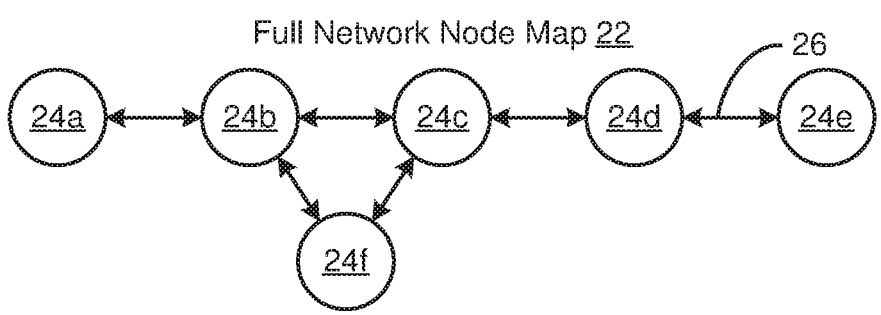
FIG. 3 is a schematic diagram illustrating a normal workflow and an altered workflow that combine to form a corresponding node network.
Figure 3:
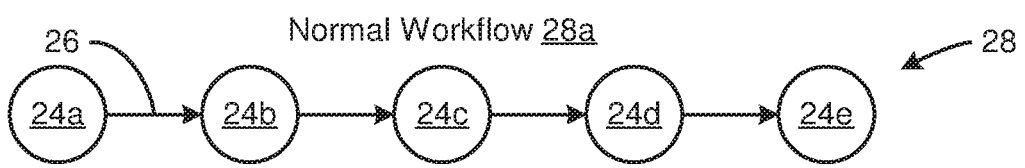
Figure 3:
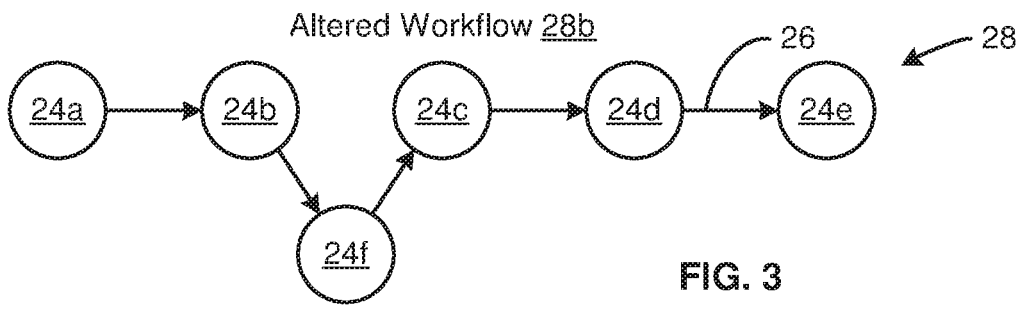

Referring to FIG. 3, within a particular network node map 22 may be one or more sequential flows of events. Each such sequential flow of events may be a workflow 28. A workflow 28 may include multiple nodes 24 and define an order and direction of flow through those various nodes 24. In selected embodiments, the nodes 24 of a workflow 28 may represent events or subtasks that a robot 12 executes (e.g., webpages that a robot 12 visits and interacts with) on its way to accomplish its designated goal. The last node 24e within a workflow 28 may correspond to successful completion of the goal. For example, the last node 24e in a workflow 28 may be a "confirmation" webpage.

Accordingly, to complete a workflow 28 (i.e., reach the goal corresponding to the workflow 28), a robot 12 may progress through a sequence of nodes 24. During the progression, the robot 12 may make decisions based on information obtained from a knowledge base 18. The knowledge base 18 may provide information about the workflow 28 in general. It may also provide information about a specific website that the robot 12 navigates in order to complete the workflow 28. A robot 12 may also make decisions based on information gathered from a website such as price data, text information, or other data recovered during the process.

Assuming a website has not been modified, a robot 12 may follow a "normal" workflow 28a (i.e., a workflow 28a that one or more robots 12 have followed in the past). However, if a website has been modified or a link has been changed in some manner, a robot 12 may be unable to follow a normal workflow 28a. Accordingly, a robot 12 may learn a new or altered workflow 28b.

For example, in a normal workflow 28a, a robot 12 may directly progress from a first node 24b to a second node 24c. However, in a specific instance or after a particular change to a corresponding website, a robot 12 may not be able to directly progress from the first node 24b to the second node 24c. Rather, the robot 12 may be required to progress from the first node 24b, to an intermediate node 24f, and then to the second node 24c.

Since a robot 12 may not know beforehand that a node map has changed nor how it has changed, the robot 12 may continue attempting to reach its goal by trying out different learned rules. If the robot 12 succeeds in its task and reaches its assigned goal, the robot 12 may declare a successful effort and update a corresponding database to reflect the change in the workflow 28. For example, a network node map 22 within a node map database 20c may be updated to reflect or include the normal workflow 28a and the altered workflow 28b. Alternatively, or in addition thereto, a robot 12 may scan a node 24 (e.g., a webpage) that has changed and re-characterize the node 24 completely and annotate a node list with new information.

Accordingly, a system 10 may provide, enable, or support a learning process wherein a robot 12 learns new information about the state of the world and updates a knowledge base 18 (e.g., one or more databases 20 within a knowledge base 18) to reflect that new information. This new information may then be available to any other robot 12 that has access to the knowledge base 18 or selected databases 20 thereof. On the other hand, if a robot 12 is unable to accomplish its assigned goal, it may declare an error and set a corresponding flag in the system 10. A human operator may then manually inspect the error and make the necessary changes to the system 10 (e.g., knowledge base 18) in order to reflect the changes in the node map.

In selected embodiments, there may be many network maps 22 contained in a node map database 20c in accordance with the present invention. The web may be thought of as one gigantic dynamic network node map 22. However, a system 10 may create, define, and/or store many useful node map segments that are repeated often through the web.

For example, a system 10 may create, define, and/or store one or more workflows 28. In selected embodiments, a workflow 28 may include about 10 to about 20 nodes in a small network. Thus, navigating such a workflow 28 may essentially be following a node map by filling in data on each webpage and proceeding to the next node in the workflow 28.

Network node maps 22 may generally be or include a complete path from start to the end point where the assigned goal of the corresponding robot 12 is reached. However, a collection of small network node maps 22 may be useful in helping a robot 12 explore unknown areas of the web. For example, a robot 12 may use different node maps 22 in conjunction with key words and/or key phrases and a database of robot credentials to get (e.g., via trial and error) data out of a database on the web.

Figure 4:
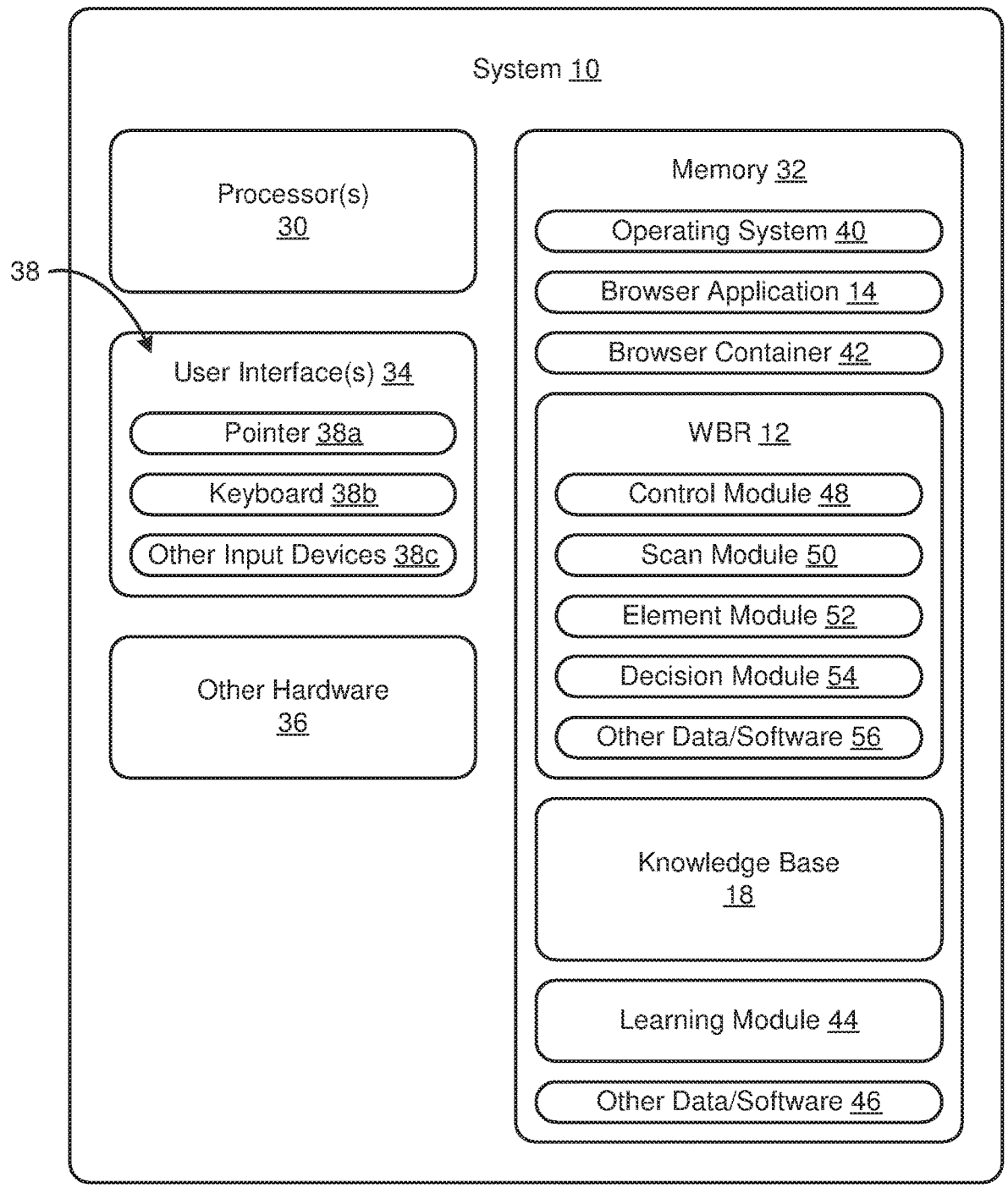
FIG. 4 is a schematic block diagram of one embodiment of a system in accordance with the present invention.

Referring to FIG. 4, in selected embodiments, a system 10 in accordance with the present invention may comprise computer hardware and computer software. The computer hardware of system 10 may include one or more processors 30, memory 32 (e.g., one or more memory devices), one or more user interfaces 34 or interface devices 34, other hardware 36, or the like or a combination or sub-combination thereof. The memory 32 or selected portions thereof may be operably connected to the one or more processors 30 and store one or more portions of the computer software. This may enable the one or more processors 30 to execute the computer software.

A user interface 34 of a system 10 may enable an engineer, technician, or other user to interact with, customize, or control various aspects of a system 10. In selected embodiments, a user interface 34 of a system 10 may include one or more input devices 38. Suitable input devices 38 may include one or more pointing devices 38a (e.g., a mouse), buttons, keys, keyboards 38b, touch screens, other input devices 38c, or the like or a combination or sub-combination thereof. In other embodiments, a user interface 34 of a system 10 may simply comprise one or more connection ports, pairings, or the like that enable an external computer to interact or communicate with the system 10.

In selected embodiments, the memory 32 of a system 10 may store software programmed to provide, enable, or support the operation of one or more robots 12. Such software may have any suitable configuration. In certain embodiments, the software of system 10 may include one or more operating systems 40, browsers 14 (e.g., browser applications), browser containers 42, robots 12, knowledge bases 18, learning modules 44, other software modules 46 or supporting data, or the like or a combination or sub-combination thereof.

An operating system 40 may manage hardware and software resources in order to provide common services for various computer programs. In selected embodiments, an operating system 40 may manage hardware and software resources in order to provide an environment in which a browser 14 may operate under the control of a robot 12.

A web browser 14 may be a software application programmed to access certain resources available on the web and render aspects thereof viewable by a user. In selected embodiments, a web browser 14 may run within an environment provided by an operating system 40. For example, in certain embodiments, the hardware and software of a system 10 may include or provide one or more virtual machines, each with its own operating system 40. Each such operating system 40 may enable or support a corresponding browser 14. Conversely, a browser 14 may run within a browser container 42.

A browser container 42 may be software that supports the operation of a browser 14 without having all the functionality of an operating system 40. In selected embodiments, a browser container 42 may be software that is capable of writing C++ code. For example, a suitable browser container 42 may be software marketed under the "Unity," "Mono," ".NET," or "Qt" tradenames or the like. In selected embodiments, the hardware and software of a system 10 may include or provide one or more browser containers 42, each supporting its own browser 14. Such an arrangement may provide many of the benefits associated with a plurality of virtual machine (e.g., prevent cross talk between browser applications 14, improved security, etc.), without requiring as much software overhead, creation time, destruction time, or the like.

In selected embodiments, one or more robots 12 of a system 10 may comprise software programmed to provide, enable, or support the desired operation thereof. Such software may have any suitable configuration. In certain embodiments, the software forming a robot 12 may include a control module 48, scan module 50, element module 52, decision module 54, other data or software 56, or the like or a combination or sub-combination thereof.

A control module 48 may enable a robot 12 to control the operation of a browser 14. For example, a control module 48 may open and/or close a browser 14, direct a browser 14 to a selected URL, or the like. A control module 48 may also contain and/or control one or more input devices. For example, a control module 48 may contain and/or control a virtual system pointer (e.g., virtual system mouse), a virtual system keyboard, a virtual application pointer (e.g., virtual application mouse), a virtual application keyboard, or the like a combination thereof in order to make selections, place a cursor, enter text, or otherwise interact with a webpage.

For example, a control module 48 may contain and/or control a virtual system pointer and a virtual system keyboard that enable a corresponding robot 12 to access or control any aspect of a web browser 14, operating system 40, and/or browser container 42. Thus, a virtual system pointer and a virtual system keyboard may provide to a robot 12 the same interactions and options that a standard, physical mouse and keyboard provide to a human user.

Alternatively, or in addition thereto, control module 48 may contain and/or control a virtual application pointer and a virtual application keyboard that enable a corresponding robot 12 to access or control certain interactions and options within a specific application. For example, a JAVASCRIPT mouse operating within the confines of a web browser 14 may be an example of a virtual application pointer.

A robot 12 may use different input devices in different situations or applications. For example, a virtual application pointer and/or keyboard (e.g., a JAVASCRIPT mouse and/or keyboard) may perform well certain functions when within a web browser 14, but may interfere with the operation of the web browser 14 when performing other functions. Accordingly, a virtual application pointer may used to perform those certain functions and a virtual system pointer may be use to perform the other functions.

A scan module 50 may enable a robot 12 to scan the rendered elements of a webpage. By so doing, a scan module 50 may identify the various elements rendered on the webpage. A scan module 50 may also identify or determine the boundaries of the rendered elements.

An element module 52 may enable a robot 12 to determine what the various elements rendered on a webpage are and/or what they mean. For example, an element module 52 may enable a robot 12 to distinguish between elements corresponding to images, fields, labels, links, buttons, text, or the like. Thus, once a scan module 50 has identified the various elements rendered on a webpage, an element module 52 may classify each of those elements.

The classification performed by an element module 52 may guide how a robot 12 interacts with the various rendered elements of a webpage. For example, if an element module 52 determines that a first element is an image, a robot 12 may largely ignore that element. On the other hand, if an element module 52 determines that a second element is a text-input field, a robot 12 may then try and decide whether to enter data (e.g., text) into that field and which data to enter.

A decision module 54 may enable a robot 12 to decide what to do in any of various situations. In certain embodiments, a decision module 54 may decide what type of webpage is currently before (e.g., being "viewed" by) a robot 12. For example, based on the data collected by a scan module 50 and an element module 52, a decision module 54 may decide whether a particular webpage is a product page, a page for entering purchase data such as shipping address, credit card information, billing address, or the like, a confirmation page, or the like. Accordingly, a decision module 54 may decide or determine a current location within a node network 22 or workflow 28 and whether a robot 12 should advance or retreat to a different node 24.

Alternatively, or in addition thereto, a decision module 54 may decide how to respond to a webpage before a robot 12. For example, if an element module 52 determines that a webpage currently being viewed by a robot 12 contains a significant number of text-input fields, a decision module 54 may decide whether to enter data into one of more of those fields and which data should be entered into which fields.

In selected embodiments, a element module 52 and/or a decision module 54 may form part of a scan module 50. Accordingly, determining: (a) what the various elements rendered on a webpage are and/or what they mean; and/or (b) what to do in any of various situations may be considered to be part of a scan process supervised, support, and/or controlled by a scan module 50.

A learning module 44 may analyze the experiences of and/or data collected by one or more robots 12 in order to identify and/or create rules that may be added to a knowledge base 18. In selected embodiments, a learning module 44 may do this by applying machine learning techniques. Accordingly, a system 10 may continuously improve the quality and applicability of certain rules within a knowledge base 18. In this manner, the capabilities of the robots 12 of a system 10 may be continuously improved or expanded.

Figure 5:
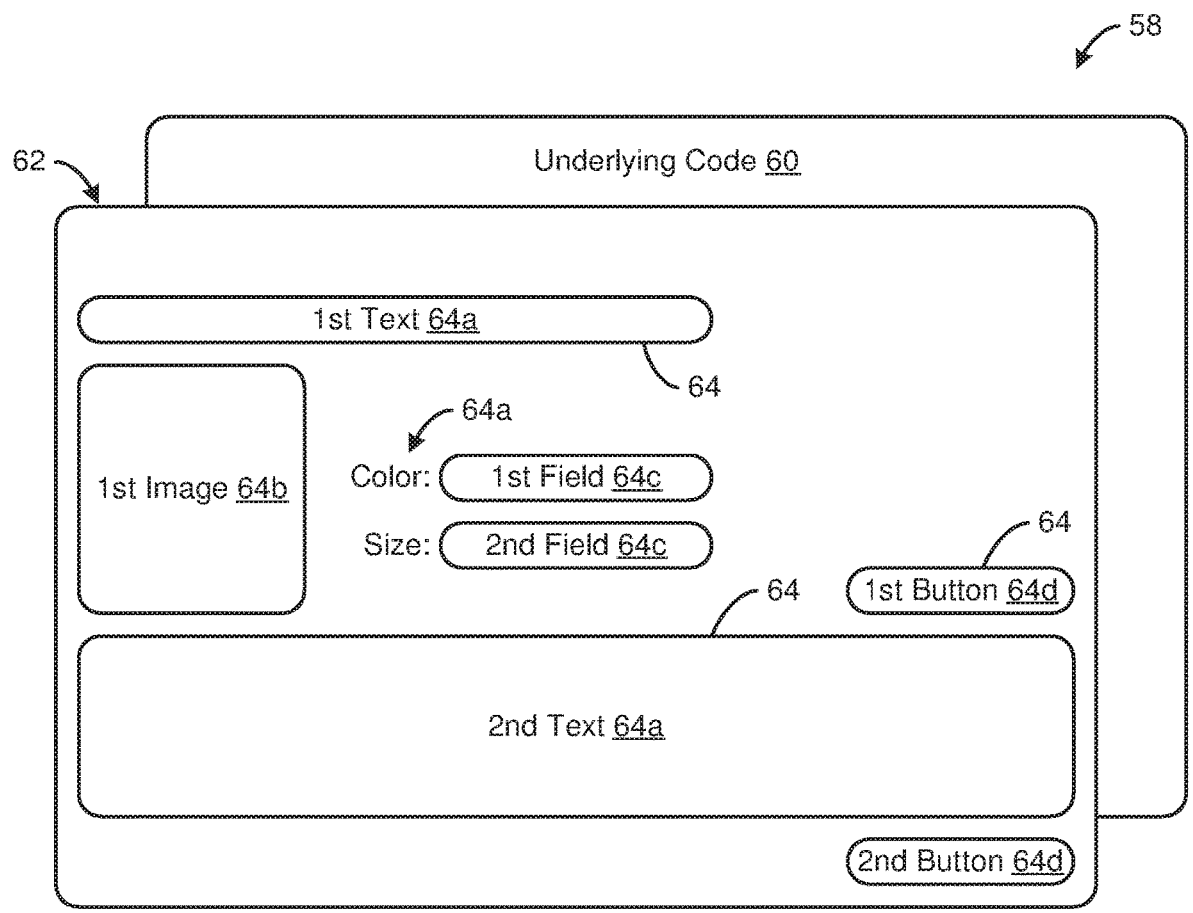
FIG. 5 is a schematic diagram illustrating one embodiment of a webpage in accordance with the present invention.

Referring to FIG. 5, as a robot 12 seeks to accomplish a goal, it may advance through a process of analyzing node 24 after node 24 and completing each corresponding step along the way. In certain embodiments, each section of a node map 22 may contain information that may be referred to as context. Context may describe or characterize the purpose of a given node 24 or plurality of nodes 24. For example, the context may be "product purchase," "data retrieval," "general information page," or the like. The context may relate to a goal assigned to a robot 12. In selected embodiments, the context may be useful when choosing synonyms to characterize multiple possible functions corresponding to a given button or field.

In certain embodiments, a node 24 may be a specific webpage 58 or part of a specific webpage 58 with which a robot 12 needs to interact. A webpage 58 may have two parts. A first part may be a computer file comprising or defining the background or underlying code 60. The second part may be the screen view 62 rendered by a browser 14 based on the underlying code 60. In selected embodiments, a screen view 62 may comprise various rendered elements 64. Such elements 64 may include text 64a, graphics or other images 64b, fields 64c, buttons 64d, or the like or a combination or sub-combination thereof.

In selected embodiments, at a node 24 or a webpage 58 forming the node 24, a robot 12 may: (a) analyze the elements 64 visually rendered on the webpage 58; (b) determine the positions of the elements 64 on that webpage 58; (c) map the elements 64 to the appropriate actionable units (e.g., fields, buttons, or the like listed in the knowledge base 18); and (d) take appropriate action (e.g., fill in one or more fields with the proper data, push a specific button, or the like or a combination thereof).

Accordingly, as a robot 12 "views" a webpage 58, it may look for elements 64 on the webpage 58 that correspond or relate to fields 64c, buttons 64d, or the like with standard phrases such as "name" or "submit." Once a robot 12 successfully classifies the elements 64 on a webpage 58, it may fill in the necessary data, acquire information from the webpage 58, push the appropriate buttons 64d, and so forth. Thus, as a robot 12 transitions from node 24 to node 24 in its advance toward an assigned goal, it may map out the nodes 24 in of a network 22. Thus, the robot 12 may update one or more appropriate databases 20 within a knowledge base 18.

A robot 12 may analyze one or more elements 64 of a webpage 58 in order to determine a next step. For example, if the goal of a robot 12 is to buy a pair of shoes online, the robot 12 may obtain and parse a text element 64a and compare it to the keywords in the knowledge base 18 to make sure it has found the webpage 58 corresponding to the correct product. Alternatively, or in addition thereto, a robot 12 may analyze an image element 64b to confirm is has found the webpage 58 corresponding to the product it has been asked to purchase. Once a robot 12 has confirmed it is on the right track, it may proceed to the next node 24 in the process or workflow 28.

On the other hand, if a robot 12 within the system 10 has already visited the webpage 58 at issue and made the assigned purchase before (e.g., if the goal is to make another purchase of a regularly purchased item such as laundry detergent), then the robot 12 assigned the most recent iteration of the task may skip analyzing the text and/or image and proceed straight to one or more nodes 24 involved in the purchase workflow 28.

Within a workflow 28, one or more fields 64c (e.g., text-input fields) may need to be filled in with standard information such as customer name, shipping address, payment information, or the like. Accordingly, after all relevant information has been entered into an appropriate field 64c, a robot 12 may push an appropriate button 64d on a webpage 58 to complete its goal. Such a button 64d may be labeled with "buy now," "checkout," "add to cart," "continue shopping," "save for later," "add to wishlist," or the like. However, by mapping one or more of the available buttons 64d on a webpage 58 to a standard command or button function identified within a knowledge base 18, a robot 12 may identify and click the button 64d that is consistent with the goal assigned the robot 12.

In selected embodiments, when a robot 12 scans a webpage 58, it may mark elements 64 as generic fields, buttons, images, text, etc. Alternatively, or in addition thereto, a robot 12 may map each element 64 to a known, human-interaction-element type (e.g., credit card field, shipping address field, etc.) by using geometrical and contextual clues found nearby.

For example, a field in which a user would normally enter his or her credit card information may typically have a specific geometry that would include width, height, and x,y coordinates on a webpage 58. It may also have certain text (e.g., keywords or phrases) located nearby such as "Enter Card Number" or "Expiration Year." Accordingly, a robot 12 may use geometry, nearby keywords or phrases, and/or other contextual clues to determine that a field is actually a known, human-interaction-element type (e.g., a "Credit Card Input Field"). In this manner, all fields, buttons, select lists, and/or other elements 64 that humans normally would interact with may be identified.

Thus, when a robot 12 enters a node network 22 or a workflow 28 comprising a subset of a node network 22, the robot 12 may seek to identify every node 24 thereof. If the node identification is successful, the robot 12 may complete its assigned task successfully by reaching a termination node 24e (e.g., a purchase confirmation page). If the robot 12 is unsuccessful in identifying one or more nodes 24, the robot 12 may try other methods documented within a knowledge base 18. If the robot 12 eventually succeeds using a trial-and-error methodology, the robot 12 may flag the successful method as a new learned rule and enter this new method as a new rule in the knowledge base 18. If the robot 12 is ultimately unsuccessful, it may flag the corresponding nodes 24 for further review by a system supervisor (e.g., a human or a more capable robot 12).

Robots 12 in accordance with the present invention may be programmed to deal with unexpected elements 64 such as pop-up windows during web browsing. Dealing with a pop-up window may be a standardized method. In selected embodiments, such a method may comprise the robot 12 looking for the button 64d on which to click and close the window.

That is, a robot 12 may use visual, textual, and/or pattern recognition techniques to process rendered elements 64 against a knowledge base 18. Thereafter, a robot 12 may use results of the processing to make decisions and take appropriate actions. As a result, a robot 12 in accordance with the present invention need not conduct a detailed, extensive, or exhaustive analysis of the complex, underlying code 60 of a webpage 58. A robot 12 is, therefore, largely free from the limits of script coding.

Moreover, unlike web crawlers that merely collect information, robots 12 in accordance with the present invention scan webpages 58, make decisions, and act on the decisions made. In other words, while a search engine and its supporting web crawlers may collect and display information for a human user, it is up to the human user to analyze and parse the information to accomplish a desired goal. In contrast, a robot 12 in accordance with the present invention is given a goal desired by a user and the robot 12 goes to work in order to accomplish that goal. The robot 12 completes the entire task. The user does not have to process any additional information.

For example, a particular human user may want to buy a pair of shoes online. The user could conduct a search on the web by using an online search engine. The user might also look at websites that conduct their own independent searches in an effort to find the lowest price on the shoes. Still, it is up to the user to determine the best price.

On the other hand, the user may task a robot 12 in accordance with the present invention with purchasing the pair of shoes online at the cheapest possible price. The robot 12 could then avail itself of a knowledge base 18 that includes websites, pricing information, current coupons and specials, blacklisted websites, trusted merchants and so on, in order to compare prices offered by several merchants. Having access to coupons may give the robot 12 an advantage, since it is able to perform all necessary computations and determine the lowest price. A robot 12 may factor in shipping costs, which vary from vendor to vendor, into a computed price. Then, once the lowest price has been located, the robot 12 may perform the purchase on behalf of the user. This may be accomplished without any further input from the user.

Figure 6:
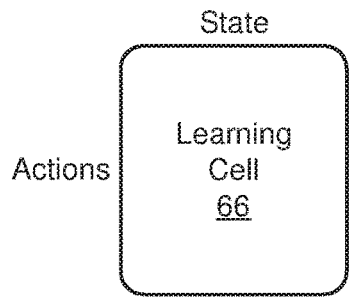
FIG. 6 is a schematic block diagram of one embodiment of a learning cell in accordance with the present invention.

Referring to FIG. 6, in selected embodiments, a learning cell 66 may be at the conceptual core of every robot 12. A learning cell 66 may be where a decision is made to take a particular action with respect to a node 24. For example, a decision module 54 may be or comprise a learning cell 66. The action decided upon may be very simple. It may be something like "push the continue button to go to the next step in the workflow." Alternatively, it may be "go to the next web site on a list of search results" or "follow a specific link." However, a learning cell 66 may hold or define many possible actions that a robot 12 may take.

In selected embodiments, an action may be decided by a weighting function contained in a learning cell 66. Most of the time, a decision may be very easy to make. However, when something unexpected happens, a robot 12 may take a new path. The various options for defining a next action may be contained in a learning cell 66. Typically, the next action taken may be the highest ranking option calculated in a learning cell 66. If the highest ranked option does not produce the desired results, a robot 12 may move on to the next highest ranking option. In this manner, a robot 12 may cycle through options until a viable option is found.

A learning cell 66 may be changed when a robot 12 deviates from a current node list or workflow 28 in order to achieve its assigned goal. For example, when a goal is achieved, a weight function within a learning cell 66 may be modified to allow the newly discovered path to receive a higher ranking going forward. This may be accomplished by adding the newly discovered path to a node network 22 and weighting one or more functions in a learning cell 66 so the sequence taken may be more likely to be used in the future. In this manner, a simple learning cell 66 may evolve and learn which paths are good and which are bad, based on current node position and later success or failure in the achieving the assigned goal.

In certain embodiments, a learning cell 66 may map a set of states to a set of corresponding actions. In essence, a learning cell 66 may be or resemble a look-up table used by a robot 12 to decide what action to take based on the state of the world at a given time. A description of a current state of a robot 12 may include or reflect a goal, context, current node, time, date, diagnostic information (e.g., robot 12 operating normally, interference detected, or the like), and so forth. For example, in a simple online purchase workflow 28, a current state may be determined by the context and the node currently occupied by a robot 12. A corresponding list of actions may include actions such as "push a button to go to the next state," "set a flag and save all data for operator examination," "go back to previous node," "run an internal diagnostic test," "open a connection to an external data source to upload further instructions," "open an external data store to dump data held locally," "open a connection to another robot to get or send an instruction," or the like or a combination or sub-combination thereof.

In selected embodiments, from a functional perspective, a robot 12 may be either in learning mode or in fast mode. A learning mode may be one in which a robot 12 is continuously defining new rules, new nodes 24, or anything else that is not contained within its knowledge base 18. In a learning mode, the contents of a learning cell 66 may be modified to better rank actions based on state. In a fast mode, a robot 12 may draw from preexisting knowledge (e.g., information contained in a knowledge base 18), while working towards an assigned goal. In this mode, a robot 12 may seek to accomplish an assigned goal at the fastest rate possible by simply using existing data from previous scans. In certain embodiments, while advancing to its assigned goal, a robot 12 may log functions and results pertaining to its workflow 28.

Alternatively, or in addition thereto, certain robots 12 in accordance with the present invention may operate within or replay on a training mode. A training mode may be when information is loaded into one or more databases 20 of a knowledge base 18 by a human operator. A robot 12 that has been trained by a human operator may be the simplest case and very useful for things like purchase flow.

In selected embodiments, a single robot 12 may be constructed to operate within more than one mode (e.g., learning, fast, and/or training mode), depending on the assigned goal. In other embodiments, one or more robots 12 may be purpose built to operate and specialize within a specific mode.

Figure 7:
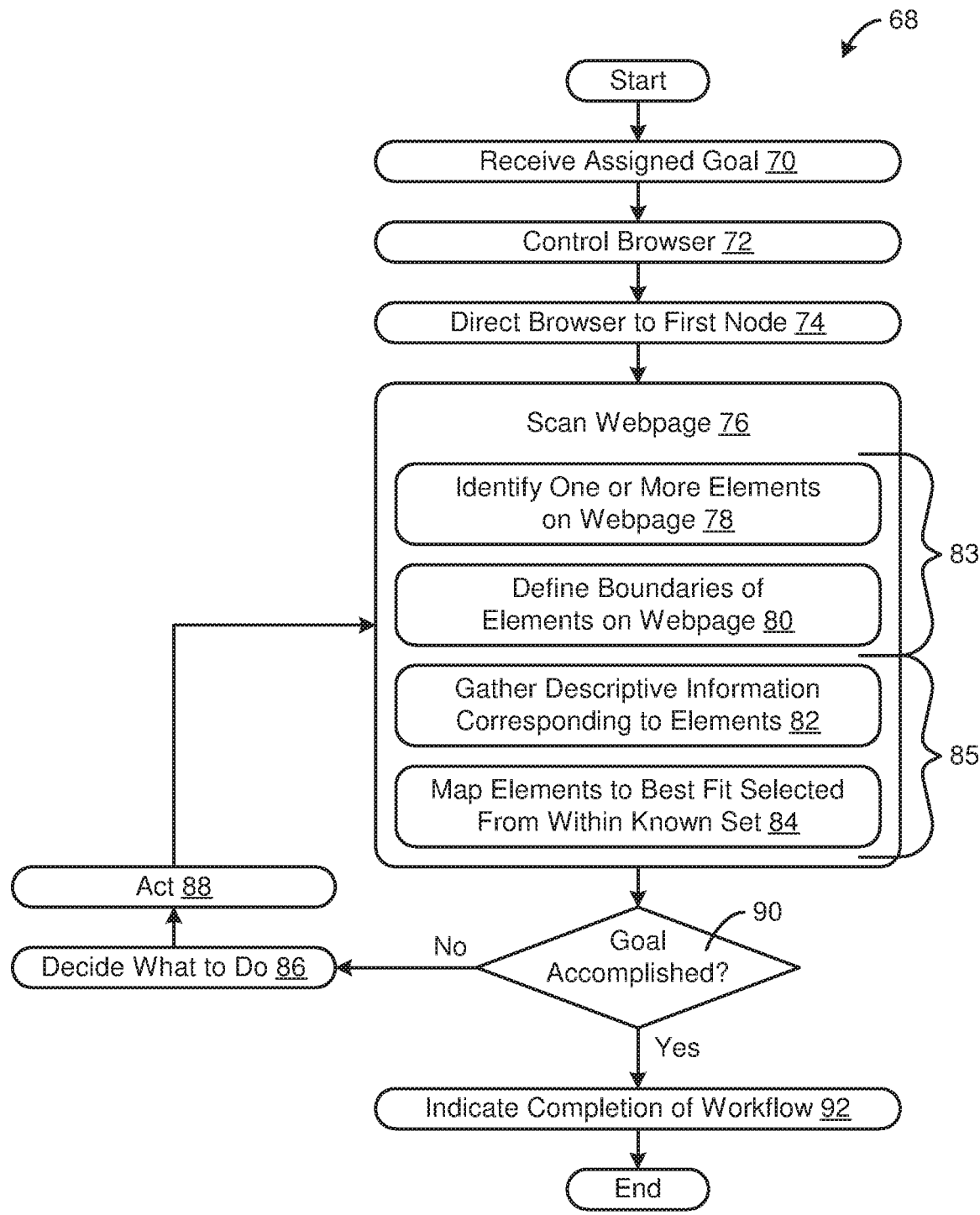
FIG. 7 is a schematic block diagram of one embodiment of a method that may be executed by a system in accordance with the present invention.

Referring to FIG. 7, a system 10 may support, enable, or execute a process 68 in accordance with the present invention. In selected embodiments, such a process 68 may be performed by a robot 12 and may begin with receiving 70 an assigned goal. Accordingly, in order to accomplish the assigned goal, the robot 12 may control 72 a browser 14 and direct 74 the browser 14 to a first node 24 (e.g., to a first webpage 58 or a portion of a first webpage 58).

The nature of the first node 24 may depend on the nature of the assigned goal. In selected embodiments, the assigned goal may correspond to a well defined workflow 28. Accordingly, in such embodiments, the first node 24 may be the first node of that workflow 28. For example, if the goal is to purchase a particular item from CABELA'S, the first node 24 may be or correspond to a high level domain such as "cabelas.com" or to a more specific product page for the product (e.g., "cabelas.com/products/particular-product"). In other embodiments, the first node 24 may be "google-.com" so that the robot 12 can obtain a list a search results to begin analyzing.

Upon reaching a node 24, a robot 12 may scan 76 the corresponding webpage 58 or portion thereof. In selected embodiments, such scanning 76 may comprise: (a) identifying 78 one or more elements 64 on a webpage 58; (b) defining 80 the boundaries of the one or more elements 64 on the webpage 58; (c) gathering 82 descriptive information corresponding to one or more elements 64; and/or (d) mapping 84 each of one or more elements 64 to a best fit selected from within a specific, closed, known set. Such scanning 76 may be accomplished in multiple ways.

In certain embodiments, scanning 76 may include or be divided into multiple phases. For example, scanning 76 may include a first phase 83 and a second phase 85. A first phase 83 may enable a robot 12 to "see" a webpage 58. A second phase 85 may enable a robot 12 to decide how best to interact with a webpage 58.

In selected embodiments, an initial or first phase 83 of scanning 76 (e.g., identifying 78 and defining 80) may comprise crawling a document object model. A document object model may set forth the hierarchy of a webpage 58. Accordingly, a robot 12 may start at the top of a document object model and find the first "grandparent," first "parent," and first "child," then run code to determine the boundaries of the element 64 that is the first child. This process may continue until all the "children" have been identified 78 and their boundaries have been defined 80.

Alternatively, an initial or first phase 83 of scanning 76 process may comprise analyzing a screen view 62 or some portion thereof using image-based pattern recognition. This may enable a robot 12 to characterize each of various elements 64 of a screen view 62 as text 64a, image 64b, field 64c, button 64d, or the like.

In still other embodiments, an initial or first phase 83 may comprise scanning a webpage 58 by probing with a mouse or other pointer. For example, a robot 12 may systematically probe a screen view 62 at multiple locations with a pointer (e.g., a virtual system mouse, virtual application mouse, or the like) and determine from the underlying code 60 the identity of an element 64 corresponding to each such location.

Each such probing effort may comprise moving a pointer to a location, then: (a) "clicking" (e.g., "right clicking") on that location; (b) observing some feature or characteristic of the webpage 58 and/or pointer (e.g., cursor) at that location; and/or (c) running code to pull up identifying information corresponding to the element 64 occupying that location from within the underlying code 60. In selected embodiments, defining 80 boundaries of an element 64 may include positioning a pointer in a location and running code to pull up boundary information corresponding to the element 64 occupying that location from within the underlying code 60. In certain embodiments, such probing may be efficiently and quickly performed using a virtual application pointer (e.g., a JAVASCRIPT mouse) and customized script code programmed to obtain selected, location-specific information from the underlying code 60.

Alternatively, or in addition thereto, identifying 78 elements 64 and/or defining 80 boundaries of elements 64 may include identifying boundaries of active areas. This may be accomplished by scanning (e.g., passing, canvassing) a virtual system mouse across a webpage 58 in a sampling manner and noting where the mouse (e.g., a symbol representing the location of the mouse) changes as it passes onto and/or off an active region or element 64 that may be selected. That is, when a mouse is over plain text or blank space, its location with respect to a screen view 62 may be shown with a first symbol (e.g., an arrow). However, as a mouse passes over a link or a button, the location may be shown with a second symbol (e.g., a pointing hand or finger). Moreover, as a mouse passes over a field for receiving text data, the location may be shown with a third symbol (e.g., a cursor).

Thus, changes in the symbol may inform a user that he or she can click in the corresponding space to interact with the webpage 58. Accordingly, this changes may be used to inform a robot 12 regarding the nature of one or more elements 64 and their respective boundaries. In certain embodiments, such a sampling technique may provide useful information, even if the information provided is not as accurate or as detailed as other sampling or scanning methods in accordance with the present invention.

In selected embodiments, scanning 76 may comprise scanning an entire webpage 58. In such embodiments, a robot 12 may identify 78 and define 80 the boundaries of each element 64 on a webpage 58. Alternatively, a robot 12 may apply one or more rules within a knowledge base 18 to determine which portion or portions of a webpage 58 to scan 76. Accordingly, in selected embodiments, a robot 12 may identify 78 and define 80 the boundaries of less than all of the elements 64 on a webpage 58.

In certain embodiments, identifying 78 an element 64 may comprise determining a high level type corresponding to the element 64. For example, elements 64 on a screen view 62 may include text 64a, hyperlinks, graphics or other images 64b, fields 64c (e.g., text-input field, pick list, or the like), buttons 64d, checkboxes, or the like or a combination or sub-combination thereof. Accordingly, identifying 78 an element 64 may comprise determining whether the element 64 is text 64a, a graphic or other image 64b, field 64c, button 64d, or the like. A robot 12 may store this information for future use.

Scanning 76 in accordance with the present invention may further include gathering 82 descriptive information corresponding to one or more elements 64. Descriptive information may provide context for an element 64. In selected embodiments, descriptive information may be used to better determine (e.g., define at a more granular level) a type corresponding to an element 64. For example, a robot 12 may look within or immediately above or to the left of a field 64c to find text describing the type of data that should be entered into the field 64c. Similarly, a robot 12 may look on a button 64d for text describing the function corresponding to the button 64d.

A robot 12 may use various techniques or approaches to gather 82 descriptive information. In certain embodiments or situations, a robot 12 may use optical character recognition (OCR) or an OCR equivalent, pixel scan, or other pattern recognition techniques in order to "read" words. This approach may be well suited for obtaining 82 descriptive information regarding buttons 64d, which are often image-based. Alternatively, or in addition thereto, a robot 12 may look for descriptive information in actual text forming part of the underlying code 62.

Descriptive information may include text, information about text, location information, or the like, or a combination or sub-combination thereof. For example, descriptive information may include information corresponding to text size, amount of text, position of text on webpage, or the like. Accordingly, descriptive information corresponding to one or more elements 64, rules within a knowledge base 18, or some combination of descriptive information and rules may be used to map 84 each of one or more elements 64 to a best fit selected from within a closed, known set.

In certain embodiments, descriptive information may be helpful in determining the context of the webpage 58 that is at issue. For example, the nature of the rendered elements 64 and/or the corresponding descriptive information may indicate that a webpage 64 at issue is a product page, payment page, shipping address page, confirmation page, or the like. This context may indicate which closed, known set of elements 64 is likely to correlate well with the webpage 58. Accordingly, a robot 12 may seek to map 84 each of one or more elements 64 to a best fit selected from within a specific, closed, known set.

Alternatively, a closed, known set may be larger and include a match for substantially any element 64 that may form part of a webpage 58. In such embodiments, the context of a website 58 may not be used to select a closed, known set. Rather, the context may be just one more factor to consider in mapping 84 each of one or more elements 64 to a best fit selected from within that large, closed, known set.

Using the screen view 62 of FIG. 5 as an example, descriptive information may indicate that the first text element 64a comprises the name of a product and that the second text element 64a comprises a description of that product. Descriptive information may further indicate that the first image 64b is an image of the product. Descriptive information may further indicate that the first field 64c is for selecting the color of the product and that the second field 64c is for selecting a size of the product. Descriptive information may further indicate that the fifth and sixth buttons are each an "add to cart" button that would advance the robot 12 toward the purchase of the product.

Continuing the example, a closed, known set may include, among other things, listings for "product name text," "product description text," "product image," "product color pick list field," "product size pick list field," and "add to cart button." Accordingly, a robot 12 may use descriptive information, rules within a knowledge base 18, or some combination of descriptive information and rules to map 84 the first text element 64a to "product name text," the second text element 64a to "product description text," the first image 64b to "product image," the first field 64c to "product color pick list field," the second field 64c to "product size pick list field," the fifth button 64d to "add to cart button," and the sixth button 64d to "add to cart button."

Thus, a robot 12 may map one or more elements 64 to one or more element types selected from a closed set of element types. The element types within that set may be high level (e.g., field, image, text, button, etc.) or more specific and/or detailed (e.g., credit card number text-input field, credit card expiration date pick list field, etc.).

Accordingly, a closed, known set may be a list of elements 64 or element types at various levels of detail that may be found on a webpage 58. In selected embodiments, a closed, known set may comprise listings from a field database 20e, button database 20f, one or more other elements listings, or the like or a combination or sub-combination thereof. For example, in certain embodiments, a large, closed, known set may include all of the listing from a field database 20e and a button database 20f.

By mapping 84 each of one or more elements 64 to a best fit selected from within a closed, known set, a robot 12 may learn what to do with each of those one or more elements. For example, if a field 64c is mapped 84 to "credit card number text-input field," then a robot 12 may learn which data to enter into that field 64c and how to do it. On the other hand, if an image 64b on a webpage 58 is mapped 84 to "product image," a robot 12 may learn that the image 64b can, most likely, be ignored.

Accordingly, based at least in part on the mapping 84, a robot 12 may decide 86 what to do with or at a particular node 24. The robot 12 may then act 88 on that decision. For example, a robot 12 may decide 86 to enter information or data from a personal database 20 into one or more fields 64c and then select a "next" button 64d or an equivalent thereof. The robot 12 may, therefore, enter 88 that information or data into the one or more fields 64c and select 88 the "next" button 64d or the equivalent thereof. Alternatively, a robot 12 may decide 86 that the node 24 is not where the robot 12 needs to be right now. As a result, the robot 12 may decide 86 to back up (e.g., return to a pervious node 24) and control a browser 14 in order to act 88 in accordance with that decision.

In selected embodiments, a robot 12 may select an action for each rendered element 64 under consideration. The action corresponding to each such rendered element 64 may be selected from a closed set contained or defined within a knowledge base 18. Additionally, the action corresponding to each such rendered element may be the action most likely to lead to the assigned goal. In certain embodiments, the action selected for particular elements 64 may be "ignore," "do nothing," or "move on." Alternatively, if an element 64a is mapped to a particular kind of text-input field (e.g., a text-input field set up to receive a certain kind of required data), then the action selected for that element 64a may be "place cursor within field and type in the appropriate data."

In certain embodiments, a knowledge base 18 may link each element 64 or element type to a set of one or more actions. Accordingly, a knowledge base 18 may define the set of actions that are potentially appropriate for each element 64 or element type. For example, the element 64 or element type "product image" may be linked to only one action, namely "ignore." The element 64 or element type "credit card number text-input field" may be linked to "place cursor within field and type in user's credit card number," "place cursor within field and type in test credit card number," or "leave field blank."

At some point within a process 68 in accordance with the present invention, a robot 12 may evaluate its current position (e.g., the current node 24) in order to determine 90 whether the assigned goal has been accomplished. In selected embodiments, such a determination 90 may be considered to be part of deciding 86 what to do. When a robot 12 determines 90 that the assigned goal has been accomplished, the robot 12 may indicate 92 or flag the workflow 28 as having been completed. If, however, the assigned goal has not yet been accomplished, the process 68 may continue with the robot 12 deciding 86 what to do, acting 88 on that decision, then scanning 76 and evaluating the next node 24 (e.g., the node 24 reached by acting 88).

Figure 8:
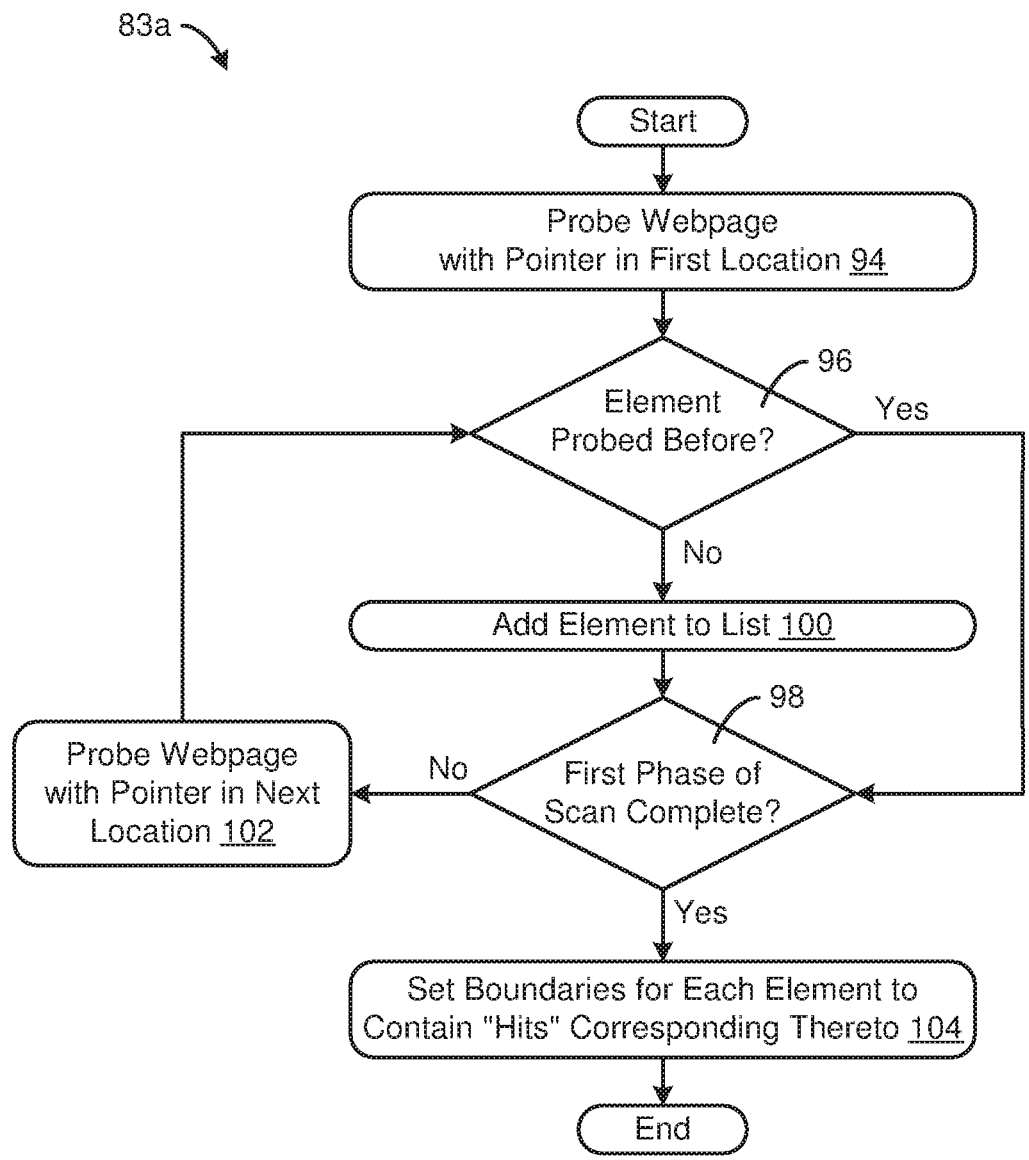
FIG. 8 is a schematic block diagram of one embodiment of a method for scanning webpages in accordance with the present invention.

Referring to FIG. 8, in selected embodiments, scanning 76 a node 24 may comprise a systematic march from location to location across a webpage 58, probing the webpage 58 at each location. For example, in one embodiment of a first phase 83a of a scanning process 76, a robot 12 may probe 94 a first location on a webpage 58 with a pointer. Probing 94 at that first location may enable a robot 12 to read or otherwise obtain an identification of the element 64 located below the pointer. In selected embodiments, the identification may be obtained from the underlying code 60 or from a document object model corresponding thereto or based thereon.

Based on the probing 94, a robot 12 may determine 96 whether an element 64 below the pointer has been probed before. If so, the robot 12 may determine 98 whether a first phase 83a of the scanning process 76 of the web site 58 is complete. Conversely, if the element 64 below the pointer has not been probed before, the element 64 may be added 100 to a list of elements corresponding to the webpage 58. Once the element 64 is added 100 to the list, the robot 12 may move on to determine 98 whether the first phase 83a of the scanning process 76 of the website 58 is complete.

If the first phase 83a of the scanning process 76 is not complete, the robot 12 may probe 102 the next location on the webpage 58 with a pointer. Based on this probing 102, a robot 12 may determine 96 whether an element 64 below the pointer has been probed 94, 102 before and the process 83a may continue in a repeating or iterative manner. Accordingly, as a robot 12 advances a pointer from location to location, the various elements 64 of a webpage 58 may be probed 94, 102 and identified 78.

The locations probed 94, 102 by a robot 12 during a scanning process 76 may be arranged or determined according to any logical scheme. For example, in selected embodiments, a robot 12 may probe 94, 102 a first plurality of locations distributed in a first row across a webpage 58 (or some portion of a webpage 58). Once a robot 12 has probed 94, 102 the first plurality of locations, the robot 12 may move on to a probe 94, 102 a second plurality of locations distributed in a second row. Accordingly, a robot 12 may probe 94, 102 row-by-row until the scan 76*a* is complete. In other embodiments, a column-by-column probing scheme may be used.

The spacing between the various locations probed 94, 102 by a robot 12 may be selected to provide a desired resolution. For example, a probing scheme may define a horizontal spacing of four pixels and a vertical spacing of four pixels between the locations probed 94, 102 by a robot 12. Thus, a robot 12 may probe 94, 102 every fifth pixel across each row and down each column. A probing scheme with a higher resolution may enable the boundaries of the various elements 64 to be determined 80 with greater precision, but may require more processing time. Conversely, a probing scheme with a lower resolution may limit the precision with which the boundaries of the various elements 64 can be determined 80, but may require less processing time.

Once it is determined 98 that a first phase 83*a* of the scanning process 76 is complete, the robot 12 may set 104 boundaries for each element 64 to contain all "hits" corresponding to that element 64. For example, if ten probing efforts in a particular area of a screen view 62 all hit on a particular element 64, then a robot 12 may effectively draw a rectangle around those hits in order to define 80 the boundaries of that element 64. A similar process may be followed for all other elements 64 that were identified 78 during the scanning process 76*a*. In this manner, one or more elements 64 may be identified 78 and the boundaries thereof may be defined 80.

Figure 9:
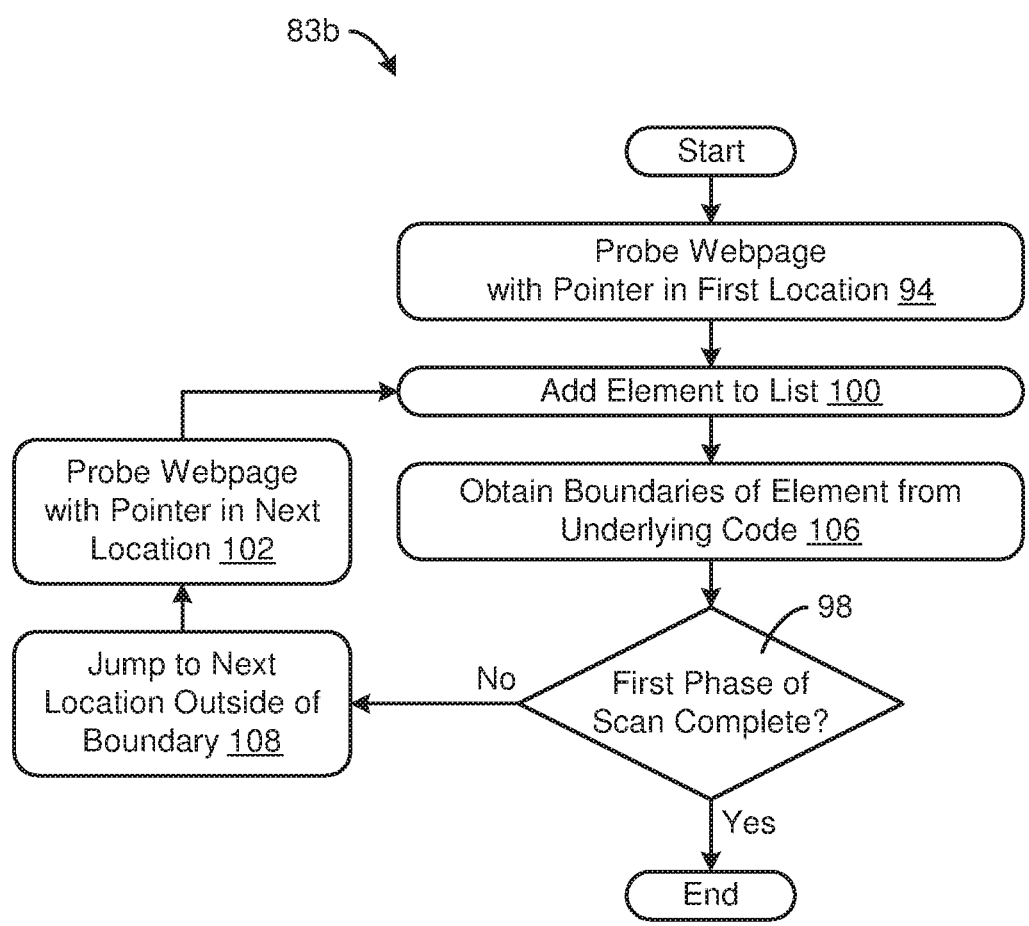
FIG. 9 is a schematic block diagram of an alternative embodiment of a method for scanning webpages in accordance with the present invention.

Referring to FIG. 9, in an alternative first phase 83*b* of a scanning process 76, a robot 12 may probe 94 a first location on a webpage 58 with a pointer. This may enable a robot 12 to identify 78 an element 64 below the first location. Accordingly, the element 64 may be added 100 to a list of elements corresponding to the webpage 58 and the boundaries of the element 64 may be obtained 106 from the underlying code 60. The robot 12 may then determine 98 whether the first phase 83*b* of the scanning process 76 of the website 58 is complete.

If the first phase 83*b* of the scanning process 76 is not complete, the robot 12 may jump 108 to a next location within the probing scheme that is outside of the boundaries of any known elements 64. Thus, a robot 12 may skip over any locations within the probing scheme that fall within the boundaries of elements 64 that have already been identified 78. This may speed the scanning process 76.

At the new location, a robot 12 may again probe 102 the webpage 58 with a pointer and the process 83*b* may continue in a repeating or iterative manner. Accordingly, as a robot 12 advances a pointer from location to location skipping over known elements 64 along the way, the various elements 64 of a webpage 58 may be probed 94, 102 and identified 78.

Figure 10:
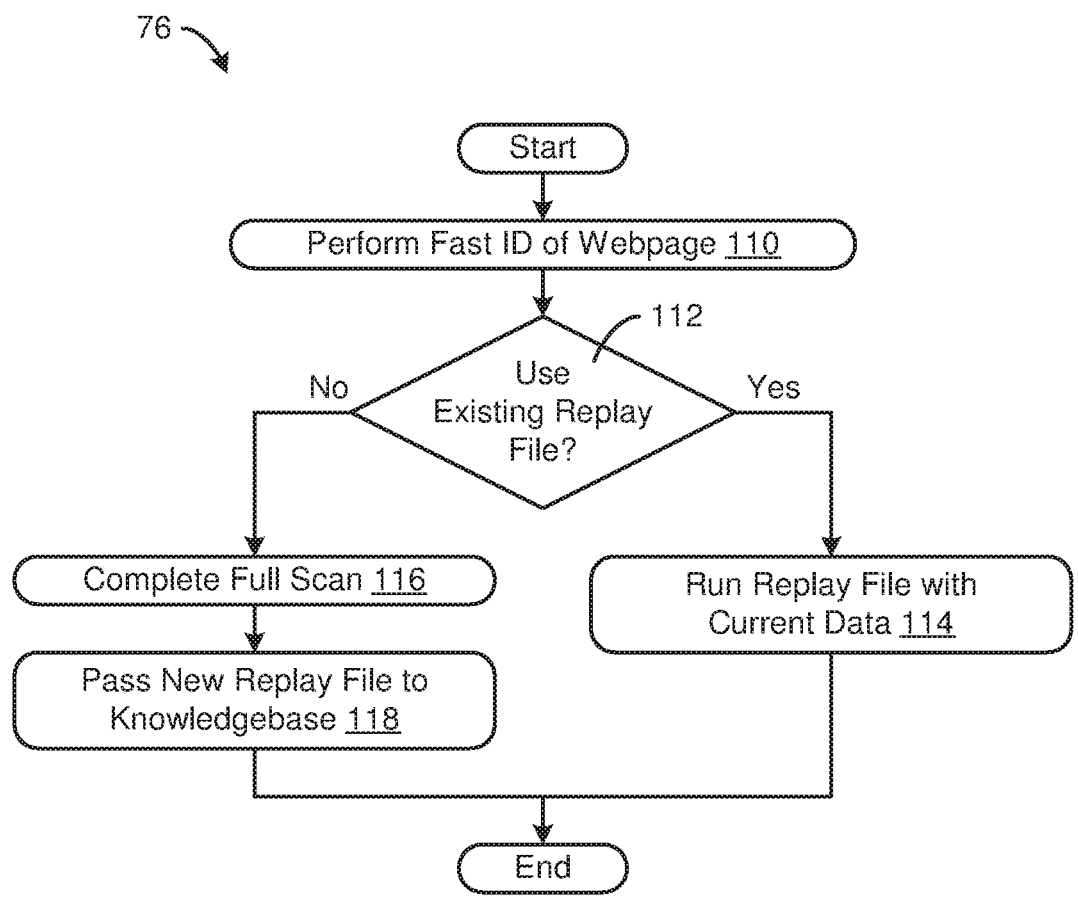
FIG. 10 is a schematic block diagram of another alternative embodiment of a method for scanning webpages in accordance with the present invention.

Referring to FIG. 10, a scanning process 76 in accordance with the present invention may contain or include different steps or sub-processes, depending on the nature of the webpage 58 at issue. In selected embodiments, a scanning process 76 may take one or more shortcuts if it is determined that a webpage 58 has not changed in any meaningful way since a robot 12 previously interacted with the webpage 58 in a successful manner.

For example, a scanning process 76 may start with performing 110 a fast identification of a webpage 58 at issue. In certain embodiments, this fast identification may be or comprise a first phase 83 of a scanning process 76 or some portion of that first phase 83. For example, a fast identification may include identifying 78 one or more elements 64 on a webpage 58 and/or defining 80 the boundaries of the one or more elements 64 on the webpage 58. In selected embodiments, this may be done using one or more of the steps found in FIG. 8 or 9 and the written description corresponding thereto. Alternatively, a fast identification may be a different process such as directly comparing a stored image (e.g., stored within a knowledge base 18) of a past screen view 62 (or portion thereof) of a webpage 58 to a current screen view 62 (or portion thereof) of the webpage 58.

If the fast identification process indicates that a webpage 58 is unchanged in all material respects, a robot 12 may elect to use 112 an existing replay file. Accordingly, a robot 12 may run 114 or otherwise employ a replay file to interact with a webpage in a "replay" manner, wherein new data (e.g., personal data corresponding to the goal of the present robot 12) may be substituted into current operations that track or are patterned after previous operations performed on the webpage 58 may one or more other robots 12. This may be a relatively fast process and/or consume relatively few computational resources.

On the other hand, if the fast identification process indicates that a webpage 58 has changed in at least some material respect, a robot 12 may elect to not use 112 an existing replay file. Accordingly, the robot 12 may perform 116 or continue performing a full scanning process 76. Accordingly, the robot 12 may (a) identify 78 one or more elements 64 on a webpage 58; (b) define 80 the boundaries of the one or more elements 64 on the webpage 58; (c) gather 82 descriptive information corresponding to one or more elements 64; and/or (d) map 84 each of one or more elements 64 to a best fit selected from within a specific, closed, known set.

At some point in the performance 116 or continued performance a full scanning process 76 or in some association therewith, a corresponding robot 12 may pass 118 a new replay file to a knowledge base 18. In selected embodiments, when a webpage 58 is scanned 76, processed, and/or executed by a robot 12, the robot 12 may generate a log file that contains critical scan information about the webpage 58. This information may be reused to eliminate the need for a full scan 76 when the webpage 58 is encountered again in the future. This information may be referred to as a replay file for that specific webpage 58.

In certain embodiments, a replay file may include information defining or characterizing an identification of a webpage 58, a list of one or more elements 64 found on the webpage 58, element types of one or more elements 64, locations of one or more elements 64 within a screen view 62, text, numerical values, sequential element-action list, or the like or a combination or sub-combination thereof. Accordingly, should a robot 12 reach the webpage 58 at issue in the future, a suitable reply file may be available within a knowledge base 18.

There may be many replay files that are slightly different, based on the specifics of how a particular webpage 58 is being used. These files may be run by a robot 12 to avoid the need for a full scan process 76. In selected embodiments, a robot 12 may identify an appropriate replay file based on a signature that is created by running one or more tests on a website 58 during a scan 76. The one or more tests may be repeated rapidly when a robot 12 returns to the webpage 58. In this way, when a robot 12 returns to a webpage 58 that has been previously scanned 76, the robot 12 may perform 110 the one or more tests on the webpage 58 in order to obtain a fast identification thereof and look up an appropriate replay file that may be run 114 to speed the overall process 68.

Figure 11:
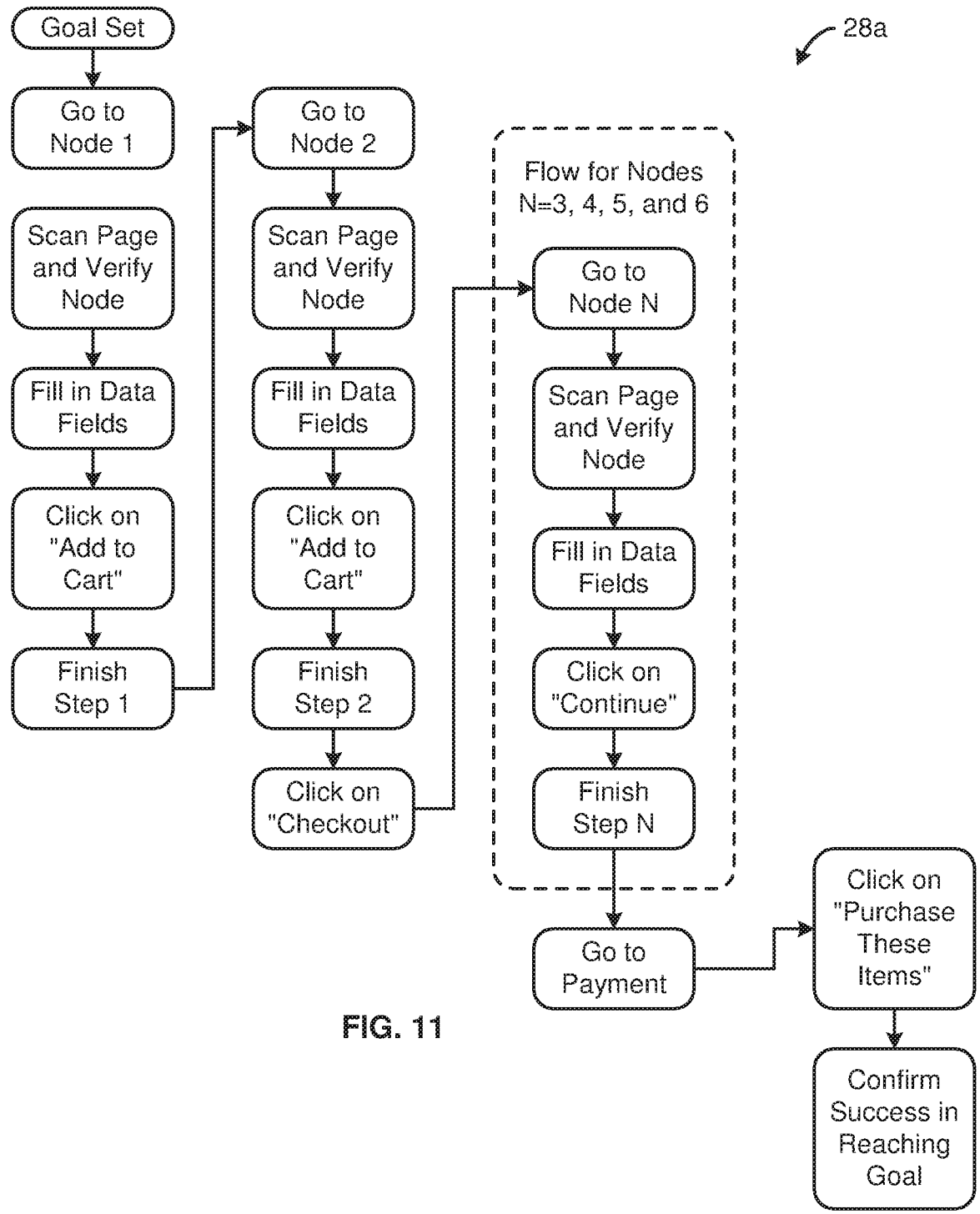
FIG. 11 is a schematic block diagram of one exemplary process that may be followed or performed by a robot in accordance with the present invention.

Referring to FIG. 11, in order to better understand how a robot 12 may operate, it may be helpful to discuss a particular exemplary workflow 28a. In this workflow 28a, a robot 12 has been assigned the goal to purchase a plurality of products from a website. Moreover, the robot 12 has received (or been granted access to) the user information, product list, node list, and the website from which to purchase the products.

A first node 24 in a node list may correspond to a first webpage 58 listing a pair of pants in a particular size and color. Accordingly, the robot 12 may initially proceed to the first webpage 58, scan 76 the webpage 58, and verify that the webpage 58 corresponds to the node 24 the robot 12 expected to see. Next, the robot 12 may enter the relevant data in one or more fields 64c and select an "Add to Cart" button 64d. The first step may then be complete and the robot 12 may proceed to a second node 24.

A second node 24 may correspond to a webpage 58 listing a tee shirt in a particular size and color. The sequence of steps followed for a second nod e 24 may be similar to those followed for the first node 24. Accordingly, the robot 12 may scan 76 the webpage 58, verify the webpage 58 is the correct node 24, enter data into one or more fields 64c as necessary, and select an "Add to Cart" button 64d. Assuming that the assigned goal was only to purchase these two items (e.g., the pants and the tee shirt), the robot 12 may then select a "Checkout" button 64d and proceed to a checkout process.

The next steps, corresponding to nodes 3 through 6, may correspond to the checkout process. For each of these nodes 24, a robot 12 may go through the same sequence of operations. Namely, the robot 12 may scan 76 the webpage 58, verify the webpage 58 is the correct node 24, enter the necessary data into one or more fields 64c, and take the appropriate action (e.g., select the "Continue" button 64d). Next, the robot 12 may go to a final payment step. In the final payment step, the robot 12 may select a "Purchase" button 64d. The robot 12 may then read a confirmation message and declare that it has successfully accomplished the assigned goal.

Figure 12:
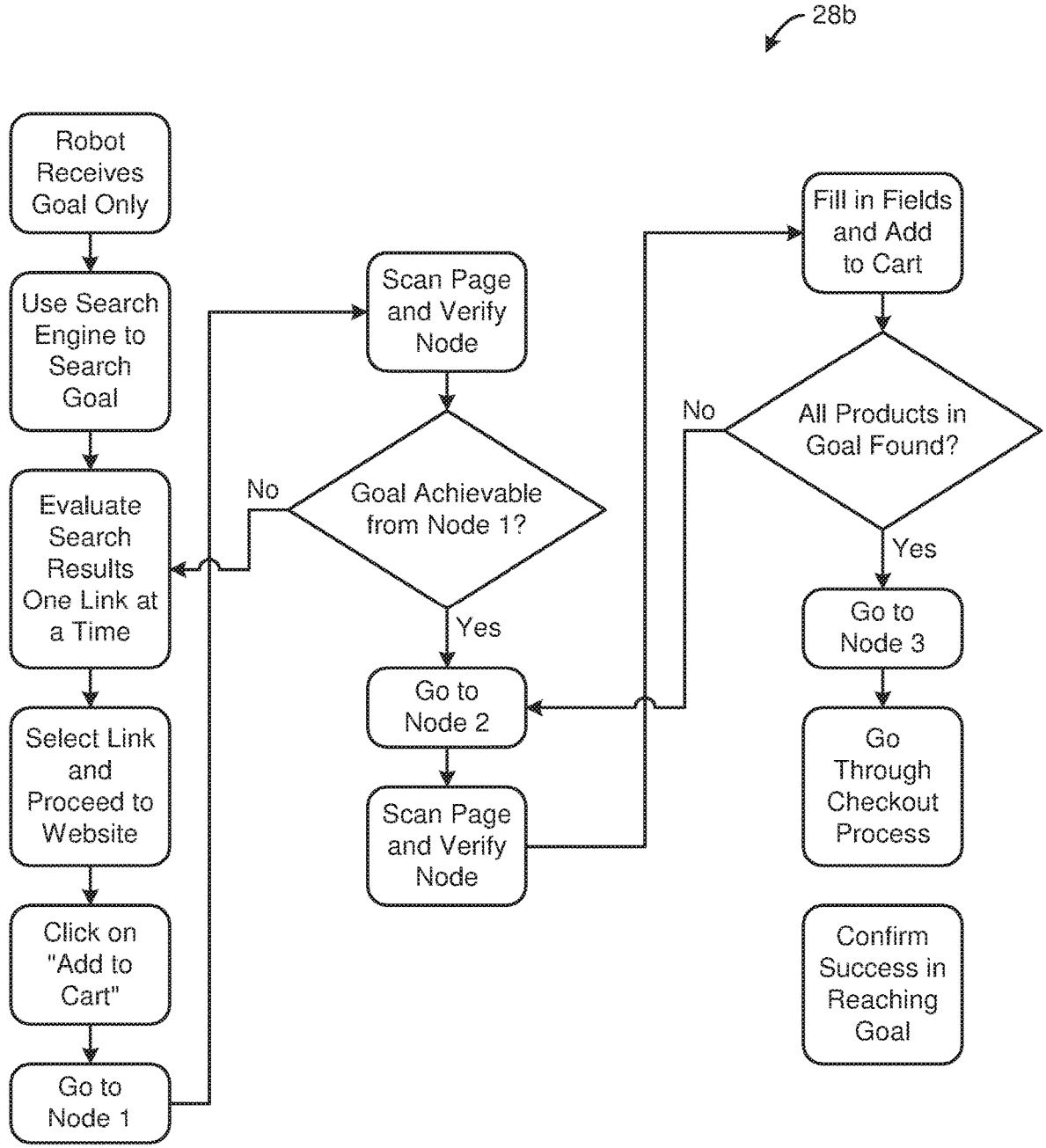
FIG. 12 is a schematic block diagram of another exemplary process that may be followed or performed by a robot in accordance with the present invention.

Referring to FIG. 12, a second exemplary workflow 28a illustrates how a robot 12 may operate with greater autonomy to achieve an assigned goal. In this example, the robot 12 is only given a goal. It is not given, nor granted access to, any additional information such as the URL of a website where the items may be purchased. Accordingly, to accomplish the assigned goal, the robot 12 may use a search engine to identify one or more websites that may assist it in accomplish the goal.

The robot 12 may evaluate one at a time the search results provided by a search engine. To evaluate a search result, a robot 12 may select a link or enter an address (e.g., URL) provided in the search results and proceed to a corresponding webpage 58. The robot 12 may initially scan 76 the webpage 58 and verify the node 24. Verifying the node 24 may involve determining whether the node 24 is likely to assist in accomplishing the goal. To do this, the robot 12 may check a learning cell 66 for a list of possible actions it could perform (e.g., an action list).

For example, the robot 12 may need to determine whether the item it is looking to purchase is available on that webpage 58. If the robot 12 is not able to accomplish the assigned goal based on the current node 24, the robot 12 may return to the search results and try a different (e.g., the next) listing. On the other hand, if the robot 12 is able to move toward accomplishing the assigned goal, the robot 12 may move on to a second node 24, scan 76 and verify that node, enter data into the relevant fields 64c, and add the item to the shopping cart. The robot 12 may find the second node 24 from a node map 22 contained in a knowledge base 18.

When the robot 12 goes through all the steps corresponding to a node 24, it may check to see if there are more products remaining to be purchased. If so, the robot 12 may move on to a node 24 corresponding to the next product, and go through the cycle repeatedly till all the products have been added to the shopping cart. Once all products corresponding to the assigned goal have been added to the shopping cart, the robot 12 may proceed to another node 24 and proceed through a checkout process as described above. When the robot 12 reads or otherwise receives a confirmation of a successful purchase, it may declare that the assigned goal has been achieved.

In certain embodiments or situations, a robot 12 may encounter a node 24 that it does not have in its node map 22 or does not recognize. In such embodiments or situations, a further operation may be performed. First, a corresponding robot 12 may attempt to find the node 24 by comparing its fields 64c, buttons 64d, URL, or the like or a combination or sub-combination thereof to information in its node database 20b. Failing this, the robot 12 may assign the node 24 a name and store it as a new node that is unknown. Then, the robot 12 may consult a learning cell 66 to decide the next highest rank action to take.

The highest rank in the learning cell 66 may be based on node information, context, previous node information, assigned goal, or the like or a combination or sub-combination thereof. Typically, the action may be "proceed as workflow," based on workflow context. The robot 12 may then enter data in one or more fields 64c and select a button 64d to proceed that makes the most sense.

Based on a workflow context, the robot 12 may look for a button 64d that is titled for a workflow such as "continue," "next," or the like. The robot 12 may then select this button 64d and evaluate the next node 24 to see if it (i.e., the robot 12) now knows where it is. In many cases, the next node 24 will be back on the expected workflow 28. Often a site might add a pop up window to offer the user some kind of extra deal, or perhaps some extra security. Thus, a robot 12 may handle the unexpected window and end up continuing on the workflow 28 toward the assigned goal.

It should also be noted that there may be rules within a knowledge base 18 that override at all times all other operations of a robot 12. For example, a knowledge base 18 may include a rule such as "don't buy directly from an unmapped node 24," "don't damage websites," or the like. Such rules may ensure that a robot 12 does no harm as it evaluates options and takes action based on that evaluation.

The flowcharts in FIGS. 7-11 illustrate the architecture, functionality, and operation of possible implementations of systems, methods, and computer program products according to certain embodiments of the present invention. In this regard, each block in the flowcharts may represent a module, segment, or portion of code, which comprises one or more executable instructions for implementing the specified logical function(s). It will also be noted that each block of the flowchart illustrations, and combinations of blocks in the flowchart illustrations, may be implemented by special purpose hardware-based systems that perform the specified functions or acts, or combinations of special purpose hardware and computer instructions.

It should also be noted that, in some alternative implementations, the functions noted in the blocks may occur out of the order noted in the Figures. In certain embodiments, two blocks shown in succession may, in fact, be executed substantially concurrently, or the blocks may sometimes be executed in the reverse order, depending upon the functionality involved. Alternatively, certain steps or functions may be omitted if not needed.

It may be noted that there are many possible web-based applications that a robot 12 in accordance with the present invention may be trained to perform. Such applications may include operating as or performing: a personal assistant or personal planner; automated online purchasing where the robot 12 executes a sequence of purchases from any number of retailers on behalf of the user; a product search where a robot 12 looks for one or more specific items or a related set of products with specific price constraints; reading email; acting as online customer service professional; personal record and information searches about a specific person or thing (e.g., a house); gathering online pricing; online retail item price comparison; scanning blogs and information mining; financial analysis and planning; natural language processing; social media activities such as online dating, meeting people online, or the like (e.g., a robot 12 may be an avatar or an alias for a real person and go about interacting with other individuals online as directed); customized searches for housing, apartments, or the like; automated code writing for webpages; stock tracking and trading; language translation (e.g., translating a webpage 58 from one language to another); and/or protecting online identity.

For example, one or more robots 12 in accordance with the present invention may protect a user's online identity. The identity of a robot 12 may be constructed to minimize the online exposure of user-specific data. The robot 12 may use advanced security protocols to communicate and operate on the web. In the event that a security breach is detected, a robot 12 may dissolve itself, thereby destroying the possibility that an attacker could get access to sensitive information. The databases 20 that a robot 12 accesses may include white lists, black lists, and domain name server (DNS) checking features that prevent operations outside the assigned goal.

In select embodiments, one or more robots 12 in accordance with the present invention may test the security of a website against attacks. For example, a knowledge base 18 may include an anti-hacking rule, wherein a robot 12 acts as a proxy between an owner and the external world. Accordingly, a robot 12 may act as a gatekeeper between a datacenter and the outside world.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. A system comprising:
   at least one processor; and
   memory operably connected to the at least one processor, the memory storing a knowledge base and executable instructions programmed to cause the at least one processor to:
   receive an original workflow referencing a plurality of webpages of a website, the original workflow including a plurality of original nodes in a specific order, including at least a start node and an end node, each node of the plurality of original nodes having a corresponding webpage of the plurality of webpages and a corresponding action to perform with respect to a portion of the corresponding webpage;
   (a) determine, by a robot, that the original workflow is insufficient to reach the end node; and
   in response to (a), autonomously add, by the robot, one or more new nodes to the original workflow to obtain an updated workflow, the one or more new nodes not included in the plurality of original nodes of the original workflow and each including a new action that is not included in the plurality of original nodes of the original workflow;
   wherein the executable instructions, when executed by the at least one processor, cause the at least one processor to identify the one or more new nodes by:
   directing a web browser to render, based on code corresponding to a URL, a webpage of the plurality of webpages, the webpage comprising a plurality of rendered elements;
   identifying each rendered element of one or more rendered elements of the plurality of rendered elements;
   selecting, from a set of possible actions, an action corresponding to each rendered element of the one or more rendered elements indicated by the original workflow;
   implementing the action corresponding to each rendered element of the one or more rendered elements, the action comprising one of autonomously filling forms and autonomously interacting with at least one of a button, checkbox, and pick list;
   (b) determining that the action is effective to advance from one webpage of the plurality of webpages to another webpage of the plurality of webpages; and
   In response to (b) selecting the action as the new action of a new node of the one or more new nodes.

2. The system of claim 1, wherein the executable instructions are further programmed to cause the at least one processor to select, from the set of possible actions, the action corresponding to each rendered element of the one or more rendered elements that will lead to the end node:
   selecting the action from the set of possible actions using a learning cell.

3. The system of claim 2, wherein the executable instructions are further programmed to cause the at least one processor to update the learning cell according to a result of the action.

4. The system of claim 3, wherein the learning cell includes a machine learning model.

5. The system of claim 3, wherein the executable instructions are further programmed to cause the at least one processor to select, from the set of possible actions, the action corresponding to each rendered element of the one or more rendered elements that will lead to the end node by:
   selecting the action as corresponding to a first node in a node map corresponding to the URL and likely to advance to a webpage corresponding to a second node in the node map connected to the first node.

6. The system of claim 1, wherein the executable instructions are further programmed to cause the at least one processor to implement the original workflow without intervention by a human user.

7. A system comprising:
   at least one processor; and
   memory operably connected to the at least one processor, the memory storing a executable instructions that, when executed by one or more processors, cause the one or more processors to:

receive, with a robot, an original workflow, containing a plurality of original nodes including at least a start node and an end node, each node of the plurality of original nodes referencing a portion of one or more webpages corresponding to each node and an action to perform with respect to the portion of the one or more webpages corresponding to each node;

(a) determine, by the robot, that the original workflow is insufficient to reach the end node; and in response to (a), autonomously add, by the robot, one or more new nodes to the original workflow to obtain an updated workflow, the one or more new nodes not included in the plurality of original nodes of the original workflow and each including a new action that is not included in the plurality of original nodes of the original workflow;

wherein the executable instructions, when executed by one or more processors, further cause the one or more processors to add the one or more new nodes to the original workflow by:

selecting the one or more new nodes using a knowledge base;

implementing the new action of each node of the one or more new nodes;

(b) determining that updated workflow is sufficient to reach the end node of the original workflow; and in response to (b), updating the knowledge base to include the updated workflow.

8. The system of claim 7, wherein the executable instructions, when executed by one or more processors, further cause the one or more processors to:
   (a) determine that the original workflow is insufficient to reach the end node by determining that a first node of the plurality of original nodes is not found in the one or more webpages; and
   add, by the robot, the one or more new nodes to the original workflow to obtain the updated workflow by adding the one or more new nodes in place of the first node.

9. The system of claim 7, wherein the knowledge base includes a node map, the original workflow being a portion of the node map; and
   wherein updating the knowledge base to include the updated workflow includes adding the updated workflow to the node map.

10. The system of claim 7, wherein updating the knowledge base further comprises using machine learning.

11. The system of claim 7, wherein the new action of at least one of the one or more new nodes includes opening a connection to an external data source.

12. The system of claim 7, wherein the new action of at least one node of the one or more new nodes includes autonomously interacting with an element of the one or more webpages, the element including at least one of a button, checkbox, and pick list.

* * * * *